US011732351B2

(12) United States Patent
Lei et al.

(10) Patent No.: US 11,732,351 B2
(45) Date of Patent: Aug. 22, 2023

(54) METHODS FOR DEPOSITING A CONFORMAL METAL OR METALLOID SILICON NITRIDE FILM AND RESULTANT FILMS

(71) Applicant: Versum Materials US, LLC, Tempe, AZ (US)

(72) Inventors: Xinjian Lei, Carlsbad, CA (US); Moo-Sung Kim, Ansan-Si (KR); Jianheng Li, Santa Clara, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/458,183

(22) Filed: Aug. 26, 2021

(65) Prior Publication Data

US 2021/0388489 A1 Dec. 16, 2021

Related U.S. Application Data

(62) Division of application No. 15/757,805, filed as application No. PCT/US2016/050874 on Sep. 9, 2016, now Pat. No. 11,104,990.

(60) Provisional application No. 62/237,899, filed on Oct. 6, 2015, provisional application No. 62/217,296, filed on Sep. 11, 2015.

(51) Int. Cl.
*C23C 16/34* (2006.01)
*C23C 16/36* (2006.01)
(Continued)

(52) U.S. Cl.
CPC .......... *C23C 16/345* (2013.01); *C23C 16/303* (2013.01); *C23C 16/36* (2013.01);
(Continued)

(58) Field of Classification Search
CPC .......... H01L 21/0228; H01L 21/02274; H01L 21/0217; H01L 21/02167; H01L 21/02222;
(Continued)

(56) References Cited

U.S. PATENT DOCUMENTS 3,974,003 A 8/1976 Zirinsky et al.
8,791,034 B2 7/2014 Shealy et al.
(Continued)

FOREIGN PATENT DOCUMENTS

EP 2009139 12/2008
EP 2669248 12/2013
KR 20110056461 A 5/2011

OTHER PUBLICATIONS

Akihiko Hirata et al., "Diffusion Barrier Mechanism of Extremely Thin Tungsten Silicon Nitride Film Formed by ECR Plasma Nitridation", Jpn. J. Appl. Phys. 37 1251 (Year: 1998).*
(Continued)

*Primary Examiner* — Bilkis Jahan
*Assistant Examiner* — Victor V Barzykin
(74) *Attorney, Agent, or Firm* — Daniel C. Roth

(57) ABSTRACT

Described herein are conformal films and methods for forming a conformal metal or metalloid doped silicon nitride dielectric film wherein the conformal metal is zirconium, hafnium, titanium, tantalum, or tungsten. A method includes providing a substrate in a reactor; introducing into the reactor an at least one metal precursor which reacts; purging the reactor with a purge gas; introducing into the reactor an organoaminosilane precursors to react on at least a portion of the surface of the substrate to provide a chemisorbed layer; introducing a plasma comprising nitrogen and an inert gas into the reactor to react with at least a portion of the chemisorbed layer and provide at least one reactive site wherein the plasma is generated; and optionally purge the reactor with an inert gas; and the steps are repeated until a desired thickness of the conformal metal nitride film is obtained.

20 Claims, 2 Drawing Sheets

(51) Int. Cl.
*C23C 16/455* (2006.01)
*C23C 16/30* (2006.01)
*H01L 21/02* (2006.01)

(52) U.S. Cl.
CPC .. *C23C 16/45531* (2013.01); *C23C 16/45542* (2013.01); *C23C 16/45553* (2013.01); *H01L 21/0217* (2013.01); *H01L 21/02167* (2013.01); *H01L 21/02211* (2013.01); *H01L 21/02222* (2013.01); *H01L 21/02274* (2013.01)

(58) Field of Classification Search
CPC ............. H01L 21/02211; C23C 16/345; C23C 16/303; C23C 16/45542; C23C 16/50; C23C 16/36; C23C 16/45553; C23C 16/45531; C23C 16/4408
See application file for complete search history.

(56) References Cited

U.S. PATENT DOCUMENTS

| | | |
|---|---|---|
| 2003/0108674 A1 | 6/2003 | Chung et al. |
| 2005/0287747 A1 | 12/2005 | Chakravarti et al. |
| 2006/0138566 A1 | 6/2006 | Chakravarti et al. |
| 2008/0318443 A1* | 12/2008 | Kim .................. C23C 16/45553 438/785 |
| 2013/0078376 A1 | 3/2013 | Higashino et al. |
| 2013/0181240 A1 | 7/2013 | Chen et al. |
| 2013/0244446 A1 | 9/2013 | Naoto et al. |
| 2015/0194298 A1 | 7/2015 | Lei et al. |
| 2015/0221495 A1 | 8/2015 | Hitachi-Kokusai |

OTHER PUBLICATIONS

Gaurang Pant et. al., "Low temperature UV/ozone oxidation formation of HfSiON gate dielectric", Thin Solid Films 460 (2004) 242-246. (Year: 2004).*
X. Zhang et. al., "Structure and optical properties of Zr1—xSixN thin films on sapphire", Thin Solid Films 518 (2009) 1522-1526 (Year: 2009).*
B. Mesic et. al., "Properties of TaSiN thin films deposited by reactive radio frequency magnetron sputtering", Thin Solid Films 520 (2012) 4497-4500 (Year: 2012).*
P.M. Smith et. al., "Chemical vapor deposition of titanium-silicon-nitride films", Appl. Phys. Lett. 70, 3116 (1997) (Year: 1997).*
International Search Report for PCT/US2016/050874, dated Dec. 19, 2016.

* cited by examiner

METHODS FOR DEPOSITING A CONFORMAL METAL OR METALLOID SILICON NITRIDE FILM AND RESULTANT FILMS

CROSS REFERENCE TO RELATED PATENT APPLICATIONS

This is a divisional application of U.S. application Ser. No. 15/757,805, filed Mar. 6, 2018, which is the National Stage Entry of PCT/US2016/050874, with the filing date of Sep. 9, 2016. Application Ser. No. 15/757,805 claims benefit of U.S. Provisional Application No. 62/217,296, filed on Sep. 11, 2015 and U.S. Provisional Application No. 62/237,899, filed on Oct. 6, 2015. The previous applications, and the disclosures of Provisional Application No. 62/217,296 and Provisional Application No. 62/237,899 are all hereby incorporated by reference.

BACKGROUND OF THE INVENTION

Described herein is a method for depositing a stoichiometric or non-stoichiometric silicon nitride film that is doped with one or more Group 4, 5, 6, or 13 of the Periodic Table metal or metalloid using one or more Group 4, 5, 6, or 13 metal or metalloid precursors. More specifically, described herein are plasma-based, cyclic methods including, but not limited to, plasma enhanced atomic layer deposition ("PEALD"), plasma enhanced cyclic chemical vapor deposition ("PECCVD") methods that are used for depositing the Group 4, 5, 6, and/or 13 doped metal or metalloid dielectric films such as aluminum, gallium, indium, thallium, boron, or combinations thereof silicon nitride films that can be used, for example, in the fabrication of integrated circuit devices.

Because of its combination of unique properties, Group 4, 5, 6, 13 containing metal of metalloid dielectric films such as, without limitation, aluminum nitride (AlN) or boron nitride (BN) films can be used for a variety of electronic applications. The prior art provides different methods for preparing and using Group 13 doped metal or metalloid dielectric films such as AlSiN films. For example, U.S. Pat. No. 3,974,003, discloses a chemical vapor deposition (CVD) method for depositing a layer containing. Al, N, and which comprises providing a substrate to be coated, a carrier gas, and a gaseous mixture of nitrogen source compounds, aluminum source compounds, and silicon source material and heating the substrate to a temperature in the range of about 500-1300° to cause formation of the layer containing Al, N, and Si. The reactants, $NH_3$, $AlCl_3$, and $SiH_4$, can be used.

US Publ. No. 2015/0221495 discloses a cyclic deposition process for forming a film comprising: forming a first layer including a first element on a substrate by supplying a gas containing the first element; forming a second layer including first and second elements by supplying a gas containing the second element to modify the first layer; and forming a thin film having a predetermined thickness by setting the forming of the first layer and the forming of the second layer to one cycle and repeating the cycle at least once.

U.S. Pat. No. 8,791,034 discloses a CVD method for forming an aluminum-silicon nitride layer upon a substrate uses an metal precursor, a silicon precursor and a nitrogen precursor under CVD conditions to deposit the aluminum-silicon nitride layer upon the substrate.

The previously identified patents and patent applications are hereby incorporated by reference.

Accordingly, there is a need in the art to provide a low temperature (e.g., processing temperature of about 500° C. or less) method for depositing a conformal, high quality, Group 4, 5, 6, 13 element doped such as without limitation, an aluminum-doped silicon nitride or an aluminum-doped silicon carbonitride film wherein the film has one or more of the following characteristics: a density of 2.0 grams per cubic centimeter (g/cc) or greater, a low wet etch rate (as measured in dilute hydrofluoric acid (0.5 wt % HF)), hydrogen content less than 20 atomic weight percent %, a refractive index of 1.80 or greater, and combinations thereof.

BRIEF SUMMARY OF THE INVENTION

Figure 1:
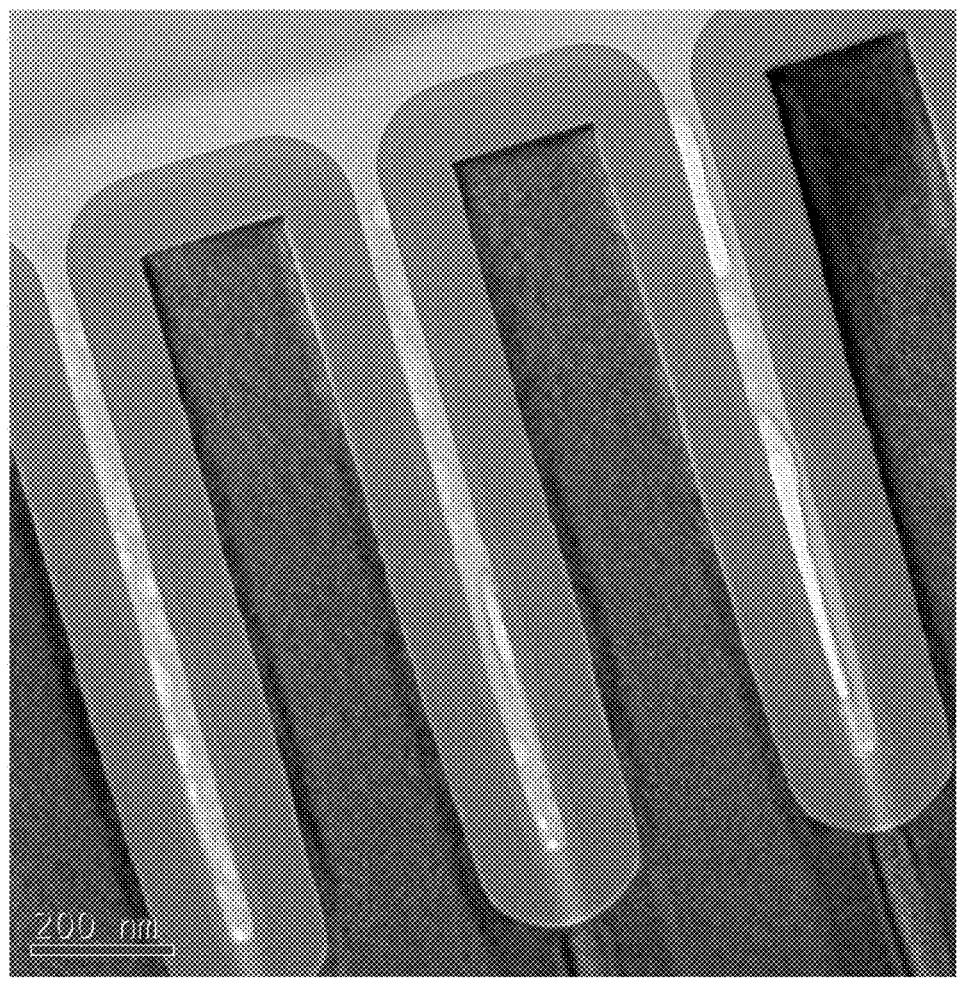
FIG. 1 provides a transmission electron microscope (TEM) image of AlSiN film deposited using tris(dimethylamino)aluminum, di-iso-propylaminosilane and nitrogen plasma as described in Example 4, which shows the following step coverage: middle 69% and bottom 78%.

Described herein are methods for forming stoichiometric or non-stoichiometric Group 4, 5, 6, 13 metal or metalloid doped silicon nitride films, such as aluminum, gallium, indium, thallium, boron, or combinations thereof doped, silicon nitride films onto at least a portion of a substrate. More specifically, described herein is an atomic layer deposition (ALD) or cyclic CVD method for depositing an aluminum-doped silicon nitride or aluminum-doped silicon carbonitride film.

In one aspect, there is provided a method for depositing an aluminum doped silicon nitride film, the method comprising the steps of:

a. providing a substrate into a reactor;
b. introducing into the reactor a metal precursor selected from the group consisting of $AlCl_3$, trimethylaluminum (TMA), triethylaluminum, tris(dimethylamino)aluminum (TDMAA), tris(dimethylamino)aluminum (TDMAA), and tris(diethylamino)aluminum (TDEAA) under process conditions sufficient to react the metal precursor and provide a chemisorbed layer;
c. purge to remove unreacted metal precursor;
d. introducing into the reactor a plasma containing source to react with at least a portion of the chemisorbed layer and provide at least one reactive site wherein the plasma is generated at a power density ranging from about 0.01 to about 1.5 $W/cm^2$;
e. purging the reactor with a purge gas;
f. introducing into the reactor an organoaminosilane precursor represented by the following Formulae I through IV below:

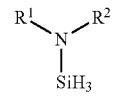

I

-continued

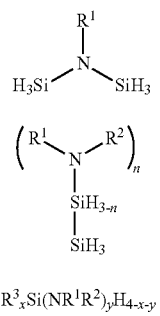

II $$\begin{pmatrix} R^1 & R^2 \\ \diagdown N \diagup \\ | \\ SiH_{3-n} \\ | \\ SiH_3 \end{pmatrix}_n$$

III $R^3{}_x Si(NR^1R^2)_y H_{4-x-y}$

IV wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring, wherein the organoaminosilane precursor reacts on at least a portion of the surface of the substrate to provide a chemisorbed layer;

g. purging the reactor with a purge gas;

h. introducing a plasma containing source into the reactor to react with at least a portion of the chemisorbed layer and provide at least one reactive site wherein the plasma is generated at a power density ranging from about 0.01 to about 1.5 W/cm²; and;

i. optionally purge the reactor with an inert gas; and wherein the steps b through i are repeated until a desired thickness of the film is obtained. In certain embodiments of Formulae I, III, and IV, $R^1$ and $R^2$ are the same. In other embodiments of Formulae I, III and III, $R^1$ and $R^2$ are different. In the foregoing or other embodiments of Formula I and IV, $R^1$ and $R^2$ can be linked together to form a ring. In these embodiments, the ring can be a substituted or an unsubstituted aromatic or aliphatic ring. In the yet further embodiments, $R^1$ and $R^2$ are not linked together to form a ring. In another embodiment, the plasma containing source is selected from the group consisting of a nitrogen and argon plasma, a nitrogen and neon plasma, an ammonia plasma, a nitrogen and ammonia plasma, an ammonia and helium plasma, an ammonia and argon plasma, an ammonia and nitrogen plasma, a $NF_3$ containing plasma, an organoamine containing plasma, and mixtures thereof. In a still further embodiment, the plasma containing source comprises a non-hydrogen containing plasma selected from the group consisting of nitrogen plasma; a plasma comprising nitrogen and helium; a plasma comprising nitrogen and argon plasma; a plasma comprising nitrogen and argon plasma, and a plasma comprising nitrogen and neon.

In one embodiment, described herein is a plasma enhanced atomic layer deposition (ALD) or plasma enhanced ALD-like method for depositing a conformal Group 4, 5, 6, 13 metal or metalloid silicon nitride or carbonitride film at a low temperature, or one or more deposition temperatures ranging from about 25° C. to about 500° C., using a Group 4, 5, 6, 13 metal or metalloid precursor and organoaminosilane precursor having Formulae I through IV described herein in a plasma process which comprises nitrogen and optionally a noble gas.

Another aspect of the invention relates to silicon containing films, conformal films and films obtained by the inventive processes. One aspect of the invention relates to an aluminum-doped silicon nitride or an aluminum-doped silicon carbonitride film wherein the film has one or more of the following characteristics: a density of 2.0 grams per cubic centimeter (g/cc) or greater, a low wet etch rate (as measured in dilute hydrofluoric acid (HF)), hydrogen content less than 20 atomic weight percent %, a refractive index of 1.80 or greater, and combinations thereof.

A further aspect of the invention relates to a gallium-doped silicon nitride or a gallium-doped silicon carbonitride film wherein the film has one or more of the following characteristics: a density of 2.0 grams per cubic centimeter (g/cc) or greater, hydrogen content less than 20 atomic weight percent %, a refractive index of 1.80 or greater, and combinations thereof.

Another aspect of the invention relates to a titanium-doped silicon nitride or a titanium-doped silicon carbonitride film wherein the film has one or more of the following characteristics: a density of 2.0 grams per cubic centimeter (g/cc) or greater, hydrogen content less than 20 atomic weight percent %, a refractive index of 1.80 or greater, and combinations thereof.

Another aspect of the invention relates to a zirconium-doped silicon nitride or a zirconium-doped silicon carbonitride film wherein the film has one or more of the following characteristics: a density of 2.0 grams per cubic centimeter (g/cc) or greater, hydrogen content less than 20 atomic weight percent %, a refractive index of 1.80 or greater, and combinations thereof.

A further aspect of the invention relates to a hafnium-doped silicon nitride or a hafnium-doped silicon carbonitride film wherein the film has one or more of the following characteristics: a density of 2.0 grams per cubic centimeter (g/cc) or greater, hydrogen content less than 20 atomic weight percent %, a refractive index of 1.80 or greater, and combinations thereof.

Another aspect of the invention relates to a tantalum-doped silicon nitride or a tantalum-doped silicon carbonitride film wherein the film has one or more of the following characteristics: a density of 2.0 grams per cubic centimeter (g/cc) or greater, hydrogen content less than 20 atomic weight percent %, a refractive index of 1.80 or greater, and combinations thereof.

The various aspects and embodiments of the invention can be used alone or in combinations with each other.

DETAILED DESCRIPTION OF THE INVENTION

The deposition of conformal, stoichiometric or non-stoichiometric Group 4, 5, 6, 13 metal or metalloid doped silicon nitride or silicon carbonitride dielectric films such as, without limitation, aluminum or boron or gallium doped silicon nitride films, at low temperature, e.g., temperatures of 500° C. or less, about 200° C to about 400° C. and in some cases about 250° C. to about 450° C., which meet one or more criteria to be considered a high quality film, has been a long-standing industry challenge. An aluminum doped silicon nitride film is considered a "high quality" film if it has one or more of the following characteristics: a density of 2.2 grams per cubic centimeter (g/cc) or greater (e.g., about 2.2 to about 3.0 g/cc, about 2.4 to about 2.9 g/cc and in some cases about 2.4 to about 2.8 g/cc) as measured by X-ray-reflectometry (XRR), a low wet etch rate (as measured in dilute hydrofluoric acid (0.5 wt % HF in DI water), a hydrogen content of 20 atomic (at.) % or less (e.g., about 1 at. % to about 20 at. %, about 5 at. % to about 20 at. % and in some cases about 1 at % to about 10 at. %) as measured by secondary ion mass spectrometry (SIMS), a refractive greater of 1.80 or greater (e.g., about 1.8 to about 2.8, about 2.0 to about 2.6 and in some cases about 2.2 to about 2.4), a low leakage current of 1E-7 A/cm$^2$ or lower (e.g., about 1E-8 A/cm$^2$ to about 9E-7 A/cm$^2$, about 1E-8 A/cm$^2$ to about 1E-9 A/cm$^2$ and in some cases about 1E-7 A/cm$^2$ to about 1E-9 A/cm$^2$) as measured by mercury probe, a high breakdown voltage of 6 MV/cm or higher (e.g., about 6 MV/cm to about 10 MV/cm, about 6 MV/cm to about 8 MV/cm and in some cases about 7 MV/cm to about 9 MV/cm) as measured by mercury probe, and combinations thereof.

Described herein are methods for forming stoichiometric or non-stoichiometric Group 4, 5, 6, or 13 element doped silicon nitride films such as aluminum doped silicon nitride, boron doped silicon nitride, gallium doped silicon nitride, indium doped silicon nitride, thallium doped nitride and combinations thereof onto at least a portion of a substrate. The content of Group 4, 5, 6, or 13 element such as titanium, hafnium, zirconium, tantalum, tungsten, aluminum, gallium, indium, can vary from 1 to 20 at %, 1 at. % to 15 at. %, and in some cases about 1 at. % to 10 at. %.

Also described herein are methods for forming a stoichiometric or non-stoichiometric aluminum or gallium doped silicon nitride film comprising silicon and nitrogen onto at least a portion of a substrate. In certain embodiments, the aluminum doped silicon nitride film further comprises carbon or aluminum such as a silicon carbonitride or silicon aluminum nitride film. In certain embodiments, the aluminum doped silicon nitride film further comprises oxygen such as a silicon oxynitride film. In this or other embodiments, the aluminum doped silicon nitride film comprises oxygen and carbon such as a silicon carboxynitride film. Throughout the description, the term "aluminum doped silicon nitride" as used herein refers to a film comprising aluminum, silicon and nitrogen selected from the group consisting of stoichiometric or non-stoichiometric aluminum silicon nitride, aluminum silicon carbonitride, aluminum silicon carboxynitride, and there mixture thereof. The content of aluminum or gallium can vary from 1 to 20 at %, 1 at. % to 15 at. %, and in some cases about 1 at. % to 10 at. %.

As previously mentioned, the films are deposited using a Group 4, 5, 6, 13 metal or metalloid precursor such as an metal precursor and an organoaminosilane which is at least one represented by the following Formulae I through IV below:

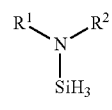

I

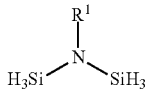

II

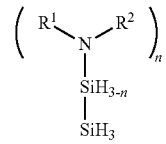

III

IV wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, a silyl group, organoaminosilyl group, halidosilyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_1$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group. Exemplary organoaminosilanes having formulae I, II, III, and IV include, but not limited to, di-iso-propylaminosilane, di-sec-butylaminosilane, phenylmethylaminosilane, 2,6-dimethylpiperidinosilane, N-methylcyclohexylaminosilane, N-ethylcyclohexylaminosilane, N-isopropylcyclohexylaminosilane, 2-methylpiperidinosilane, N-silyldecahydroquinoline, 2,2,6,6-tetramethylpiperidinosilane, 2-(N-silylmethylamino)pyridine, N-t-butyldisilazane, N-t-pentyldisilazane, N-(3-methyl-2-pyridyl)disilazane, N-(2-methylphenyl)disilazane, N-(2-ethylphenyl)disilazane, N-(2,4,6-trimethylphenyl)disilazane, N-(2,6-di-iso-pripylphenyl)disilazane, di-iso-propylaminodisilane, di-iso-butylaminodisilane, di-sec-butylaminodisilane, 2,6-dimethylpiperidinodisilane, N-methylcyclohexylaminodisilane, N-ethylcyclohexylaminodisilane, phenylmethylaminodisilane, 2-(N-disilylmethylamino)pyridine, N-phenylethyldisilane, N-isopropylcyclohexylaminodisilane, 1,1-(N,N'-di-tert-butylethylenediamino)disilane, bis(iso-propylamino)methylsilane, bis(iso-butylamino)methylsilane, bis(sec-butylamino)methylsilane, bis(tert-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, and bis(cyclohexylamino)dimethylsilane, bis(dimethylamino)silane, bis(diethylamino)silane, bis(ethylmethylamino)silane, bis(tert-butylamino)silane, tris(dimethylamino)silane, tris(iso-propylamino)silane. In some embodiments, $R^1$ is a silyl group, organoaminosilyl group, halidosilyl group in Formula II, the organoaminosilane of Formula II becomes trisilylamine (TSA, $R^1$=SiH$_3$), or TSA derivatives such as monochloro-TSA ($R^1$=ClSiH$_2$), monobromo-TSA ($R^1$=BrSiH$_2$), monoorganoamino-TSA ($R^1$=NR$^4$R$^5$ wherein $R^4$ and $R^5$ are independently selected from the group consisting of hydrogen, a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group).

The organoaminosilane precursors having Formulae I, II, III, and IV described herein exhibit a balance of reactivity and stability that makes them ideally suited as PEALD or PECCVD precursors for semiconductor device manufacturing processes. With regard to reactivity, certain precursors may have boiling points that are too high to be vaporized and delivered to the reactor to be deposited as a film on a substrate. Precursors having higher relative boiling points (e.g., greater than about 250° C.) require that the delivery container and lines need to be heated at or above the boiling point of the precursor under a given vacuum to prevent condensation or particles from forming in the container, lines, or both. Without wishing to be bound by any theory or explanation it is believed that the organoaminosilane precursors having Formula I, II, III or IV have more Si—H groups than those disclosed in prior art, thereby potentially allowing the deposition of high quality aluminum doped silicon nitride via reacting Si—H with Si—NH catalyzed by adsorbed metal precursor to form Si—N—Si linkage. It is further believed that in certain embodiments, the organoaminosilane precursors of Formula IV having Si—NH group such as bis(tert-butylamino)silane (BTBAS) or bis(sec-butylamino)methylsilane or bis(iso-propylamino)methylsilane may react with adsorbed Al-Me groups to form Al—N—Si bond, then allowing more silicon fragments to be anchored on structured substrates and promoting formation of highly conformal aluminum doped silicon nitride or silicon carbonnitride. In certain embodiments, the organoaminosilane precursors having Formula I to IV described herein comprise 2% or less by weight, or 1% or less by weight, or 0.5% or less by weight of by-product (after being stored for a time period of 6 months or greater, or one year or greater which is indicative of being shelf stable. In addition to the foregoing advantages, in certain embodiments, such as for depositing an aluminum doped silicon nitride film using PEALD, or PECCVD deposition method, the organoaminosilane precursor described herein may be able to deposit high density materials at one or more deposition temperatures, e.g., 400° C. or less, 350° C. or less, 300° C. or less, or 250° C. or less, 200° C. or less, 150° C. or less, 100° C. or less, or 50° C. or less.

In the formulae herein and through the description, the term "alkyl" denotes a group derived from an alkane by removal of one hydrogen atom and having from 1 to 10 or from 3 to 6 or from 3 to 4 carbon atoms. Exemplary linear alkyl groups include, but are not limited to, methyl, ethyl, n-propyl, n-butyl, and n-pentyl. Exemplary branched alkyl groups include, but are not limited to, iso-propyl, tert-butyl, and sec-butyl.

In the formulae herein and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In the formulae herein and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In the formulae herein and throughout the description, the term "alkenyl group" denotes a group which has one or more carbon-carbon double bonds and has from 3 to 10 or from 3 to 6 or from 3 to 4 carbon atoms.

In the formulae herein and throughout the description, the term "alkynyl group" denotes a group which has one or more carbon-carbon triple bonds and has from 3 to 10 or from 3 to 6 or from 3 to 4 carbon atoms.

In the formulae herein and throughout the description, the term "dialkylamino group" denotes a group which has two alkyl groups attached to a nitrogen atom and has from 1 to 10 or from 2 to 6 or from 2 to 4 carbon atoms. Exemplary aryl groups include, but are not limited to dimethylamino, diethylamino, and ethylmethylamino.

In the formulae herein and throughout the description, the term "alkylsilyl group" denotes a group which has at least one silicon atom as well as 1 to 10 or from 2 to 6 or from 2 to 4 carbon atoms. Exemplary alkylsilyl groups include, but are not limited to, methylsilyl ($MeSiH_2$—), dimethylsilyl ($Me_2SiH$—), trimethylsily ($Me_3Si$—). The silyl group refers to $H_3Si$— or $(H_3Si)_2NSiH_2$—.

In the formulae herein and throughout the description, the term "electron withdrawing group" denotes an atom or group thereof that acts to draw electrons away from the M-N bond. Examples of suitable electron withdrawing groups or substituents include, but are not limited to, nitriles (CN). In certain embodiments, electron withdrawing substituent can be adjacent to or proximal to N in any one of the Formulae I through III. Further non-limiting examples of an electron withdrawing group includes F, Cl, Br, I, CN, $NO_2$, RSO, and/or $RSO_2$ wherein R can be a $C_1$ to $C_{10}$ alkyl group such as, but not limited to, a methyl group or another group.

In the formulae herein and throughout the description, the term "trisilylamine derivatives" denotes a compound derived from trisilylamine. Exemplary trisilylamine derivatives include, but are not limited to, (chlorosilyl)bis(silyl)amine with a formula of $(ClSiH_2)N(SiH_3)_2$, (bromosilyl)bis(silyl)amine with a formula of $(BrSiH_2)N(SiH_3)_2$, (di-isopropylaminosilyl)bis(silyl)amine with a formula of ($^iPr_2NSiH_2)N(SiH_3)_2$, (diethylaminosilyl)bis(silyl)amine with a formula of $(Et_2NSiH_2)N(SiH_3)_2$, (dimethylaminosilyl)bis(silyl)amine with a formula of $(Me_2NSiH_2)N(SiH_3)_2$, (ethylmethylaminosilyl)bis(silyl)amine with a formula of $(EtMeNSiH_2)N(SiH_3)_2$, tris(dimethylaminosilyl)amine with a formula of $N(H_2SiNMe_2)_3$, tris(diethylaminosilyl)amine with a formula of $N(H_2SiNEt_2)_3$.

Throughout the description, the term "volatile aluminum precursor" denotes an aluminum compound having at least one Al—C bond, Al—N bond, Al-halido bond or combination thereof with a vapor.

Throughout the description, the term "volatile gallium precursor" denotes a gallium compound having at least one Ga—C bond, Ga—N bond, Ga-halido bond or combination thereof with a vapor pressure of 0.5 torr or higher at temperature of 50° C. or higher.

In certain embodiments, one or more of the alkyl group, alkenyl group, alkynyl group, alkoxy group, dialkylamino group, aryl group, and/or electron withdrawing group in Formulae I through IV may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. For example, the term "fluorinated alkyl group" denotes a group wherein the alkyl group has one or more of its atoms such, as a hydrogen atom, substituted with a fluorine atom.

Throughout the description, the term "organoamine" as used herein describes organic compound has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine. Similarly, throughout the description, the term "organoamino group" as used herein refers to an organic group consisting of at least one nitrogen atom derived from secondary or primary organoamines as described above. "Organoamino group" does not include —$NH_2$ group.

Throughout the description, the term "step coverage" as used herein is defined as a percentage of two thicknesses of the deposited metal doped silicon nitride dielectric film in a structured or featured substrate having either vias or trenches or both, with bottom step coverage being the ratio (in %): thickness at the bottom of the feature is divided by thickness at the top of the feature, and middle step coverage being the ratio (in %): thickness on a sidewall of the feature is divided by thickness at the top of the feature. Films deposited using the method described herein exhibit a step coverage of about 60% or greater, about 70% or greater, about 80% or greater, or about 90% or greater which indicates that the films are conformal.

Throughout the description, the term "dielectric films" as used herein is defined as a material having a dielectric constant of 20 or less, 10 or less, 7 or less, 6 or less, 5 or less, 4 or less as measured by mercury probe.

The method also includes a Group 4, 5, 6, 13 metal or metalloid precursor. Exemplary Group 4, 5, 6, 13 metal or metalloid precursors include, but are not limited to, trimethylaluminum, triethylaluminum, tris(dimethylamino)aluminum, tris(ethylmethylamino)aluminum, alkylaluminum chlorides (for example methylaluminum chloride, DMACl), trimethylborane, triethylborane, tris(dimethylamino)borane, tris(ethylmethylamino)borane, tris(diethylamino)borane, gallium chloride, trimethylgallium, triethylgallium, tris(dimethylamino)gallium, tris(ethylmethylamino)gallium, zirconium chloride ($ZrCl_4$), tetrakis(dimethylamino)zirconium (TDMAZ), tetrakis(diethylamino)zirconium (TDEAZ), tetrakis(ethylmethylamino)zirconium (TEMAZ), tris(dimethylamino)(cyclopentadienyl)zirconium, tris(dimethylamino)(methylcyclopentadienyl)zirconium, tris(dimethylamino)(ethylcyclopentadienyl)zirconium, tris(diethylamino)(cyclopentadienyl)zirconium, tris(diethylamino)(methylcyclopentadienyl)zirconium, tris(diethylamino)(ethylcyclopentadienyl)zirconium, tris(ethylmethylamino)(cyclopentadienyl)zirconium, tris(ethylmethylamino)(methylcyclopentadienyl)zirconium, tris(ethylmethylamino)(ethylcyclopentadienyl)zirconium, tetrakis(dimethylamino)hafnium (TDMAH), tetrakis(diethylamino)hafnium (TDEAH), tetrakis(ethylmethylamino)hafnium (TEMAH), tris(dimethylamino)(cyclopentadienyl)hafnium, tris(dimethylamino)(methylcyclopentadienyl)hafnium, tris(dimethylamino)(ethylcyclopentadienyl)hafnium, tris(diethylamino)(cyclopentadienyl)hafnium, tris(diethylamino)(methylcyclopentadienyl)hafnium, tris(diethylamino)(ethylcyclopentadienyl)hafnium, tris(ethylmethylamino)(cyclopentadienyl)hafnium, tris(ethylmethylamino)(methylcyclopentadienyl)hafnium, tris(ethylmethylamino)(ethylcyclopentadienyl)hafnium, titanium chloride ($TiCl_4$), tetrakis(dimethylamino)titanium (TDMAT), tetrakis(diethylamino)titanium (TDEAT), tetrakis(ethylmethylamino)titanium (TEMAT), tantalum chloride ($TaCl_5$), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, tungsten hexachloride, tungsten pentachloride, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof. Further exemplary Group 4, 5, 6, 13 metal or metalloid precursors include a "borane organoamine complex". A "borane organoamine complex" denotes a stable and volatile borane complex formed by reacting borane or diborane with an organoamine.

Exemplary organoamine borane complexes include, but are not limited to borane trimethylamine complex, borane triethylamine complex, dimethylamine borane, borane pyridine complex, borane morpholine complex, borane terf-butylamine complex, borane 4-methylmorpholine complex, borane N,N-diisopropylethylamine complex, borane ethylenediamine complex, 2-Methylpyridine borane complex.

In certain embodiments, the Group 4, 5, 6, 13 metal comprises aluminum. In these embodiments, the precursor is an aluminum precursor selected from the group consisting of $AlCl_3$, trimethylaluminum (TMA), triethylaluminum, methylaluminum chloride ($MeAlCl_2$), tris(dimethylamino)aluminum (TDMAA), tris(dimethylamino)aluminum (TDMAA), and tris(diethylamino)aluminum (TDEAA).

The method used to form Group 4, 5, 6, 13 metal or metalloid nitride films, such as without limitation, aluminum or boron nitride films or coatings, are deposition processes. Examples of suitable deposition processes for the method disclosed herein include, but are not limited to, plasma enhanced ALD (PEALD) or plasma enhanced cyclic CVD (PECCVD) process that use equipment known in this art. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the aluminum nitride film is deposited using an ALD process. In another embodiment, the aluminum nitride film is deposited using a CCVD process. In a further embodiment, the aluminum nitride film is deposited using a thermal CVD process. The term "reactor" as used herein, includes without limitation, reaction chamber or deposition chamber having a design and operation known in this art. The ALD-like process is defined herein as a cyclic CVD process that provides a high conformal aluminum nitride film on a substrate as shown by having at least one of the following: percentage of non-uniformity of about 5% or less as measured by ellipsometer, a deposition rate of 0.1 Å or greater per cycle, or a combination thereof.

In certain embodiments, the method disclosed herein avoids pre-reaction of the precursors by using PEALD or PECCVD methods that separate the precursors prior to and/or during the introduction to the reactor. In this connection, deposition techniques such as PEALD or PECCVD processes are used to deposit Group 4, 5, 6, 13 metal or metalloid nitride film. In one embodiment, the film is deposited via a PEALD process by exposing the substrate surface alternatively to the one or more the aluminum nitride precursor, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

In certain embodiments, the Group 4, 5, 6, 13 metal or metalloid nitride films comprise aluminum and nitrogen or boron and nitrogen or gallium and nitrogen or titanium and nitride. In these embodiments, the aluminum or boron or gallium nitride films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, nitrogen/argon plasma. In certain embodiments, the nitrogen-containing source comprises nitrogen/argon plasma source gas that is introduced into the reactor at a flow rate ranging from about 1 to about 2000 standard cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In the method described herein, a nitrogen-containing plasma comprising a nitrogen containing gas such as, without limitation, nitrogen and optionally a noble gas can be generated in situ or remotely, preferably a noble gas with an atomic mass greater than nitrogen's atomic mass (i.e., 28 amu). Without wishing to be bound by any theory or explanation, the presence of a noble gas with atomic mass greater than nitrogen's atomic mass is believed to create more atomic nitrogen radicals. The nitrogen plasma source gas is introduced into the reactor at a flow rate ranging from about 1 to about 2000 square cubic centimeters (sccm) or from about 1 to about 1000 sccm or more. The nitrogen containing plasma can be introduced for a time that ranges from about 0.01 to about 100 seconds or more. In embodiments, the precursor pulse can have a pulse duration that is greater than 0.01 seconds, and the nitrogen-containing plasma can have a pulse duration that is less than 0.01 seconds, while the water pulse duration can have a pulse duration that is less than 0.01 seconds. In yet another embodiment, the purge duration between the precursor pulse and nitrogen plasmas that can be as low as 0 seconds. In yet another embodiment, a hydrogen plasma can be generated in situ or remotely using pure hydrogen ($H_2$)) mixed with a noble gas when a hydrogen plasma can be employed. The weight percentage of the noble gas in the plasma containing both nitrogen and noble gas can vary from 1 wt % to 99 wt % (e.g., about 1 wt % to about 50 wt %, about 10 wt % to about 90 wt % and in some cases about 5 wt % to about 95 wt %), whereas the weight percentage of the noble gas in the plasma containing both hydrogen and noble gas can also vary from 1 wt % to 99 wt %.

Without wishing to be bound by theory, it is believed the plasma containing both nitrogen and a noble gas such as argon can facilitate the formation of Group 4, 5, 6, 13 metal or metalloid dielectric films such as an aluminum nitride film having less hydrogen content as well as provide reactive sites such as Al-Me or Al—$NMe_2$ groups on at least a portion of the chemisorbed surface, especially sidewalls of a structured substrate allowing to anchor silicon containing fragments onto these reactive sites in subsequent deposition cycles, thus boosting the deposition of silicon nitride on the sidewall or bottom of vias or trenches and making step coverage of 60% or greater possible since it is very difficult to achieve such as step coverage. It is further believed that the plasma density which is defined by plasma power over area of electrodes (for example, plasma power of 450 W for a 6" wafer ALD reactor, the plasma density is about 2.5 $W/cm^2$ assuming the area of electrode is same as the wafer) and is preferably lower than 2 $W/cm^2$ in order to reduce potential plasma damage on the substrate as well as any built-in structures on the substrate, yet still produce high quality aluminum nitride film which can be implemented into semi-conductor manufacturing processes. The plasma density of the method described herein ranges from about 0.01 to about 2 $W/cm^2$, or from about 0.01 to about 1.5 $W/cm^2$, or from about 0.01 to 1 $W/cm^2$. Typical plasma frequency ranges from 10 KHz to 2.4 GHz, preferably 10 kHz to 60 MHz. In some embodiments, dual RF plasma can be employed, one low frequency ranging from 10 kHz to 1 MHz and the other middle frequency selected from group consisting of 13.56 MHz and 27.1 MHz.

The deposition methods described herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and mixtures thereof. In certain embodiments, the inert gas that is used as a purge gas comprises a noble gas. The term "noble gas" as used herein means those gases found in Group 18 of the Periodic Table and include, helium (He), neon (Ne), argon (Ar), Xenon (Xe), krypton (Kr), and mixtures thereof. In one particular embodiment, the noble gas used as a purge gas comprises argon. In this or other embodiments, the purge gas comprising Ar is supplied into the reactor at a flow rate ranging from about 10 to about 2000 sccm for about 0.1 to 1000 seconds, thereby purging the unreacted precursor material and any byproduct that may remain in the reactor.

The respective step of supplying the precursors, the nitrogen-containing source, and/or other precursors, source gases, and/or reagents may be performed by changing the time for supplying them to change the stoichiometric composition of the resulting film.

Energy is applied to the at least one of the precursor, nitrogen-containing source, reducing agent, other precursors or combination thereof to induce reaction and to form the film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof by using equipment known in this art. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The Group 4, 5, 6, 13 metal or metalloid precursors, organoaminosilane having formulae I to IV, or both may be delivered to the reaction chamber such as a PEALD or PECCVD reactor either single wafer or batch in a variety of ways such as bubbling, vapor draw, or direct liquid injection (DLI). In one embodiment, a liquid delivery system may be utilized. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate. In certain embodiments of the composition described herein, exemplary solvents can include, without limitation, ether, tertiary amine, alkyl hydrocarbon, aromatic hydrocarbon, tertiary aminoether, and combinations thereof. In certain embodiments, the difference between the boiling points of the organoaminodisilane and the boiling point of the solvent is 40° C. or less. The wt % of silicon precursor compound in the solvent can vary from 1 to 99 wt %, or 10 to 90 wt %, or 20 to 80 wt %, or 30 to 70 wt %, or 40 to 60 wt %, to 50 to 50 wt %.

In certain embodiments, the gas lines connecting from the precursor canisters to the reaction chamber are heated to one or more temperatures depending upon the process requirements and the container of the metal precursor having the formulae I through IV described herein is kept at one or more temperatures for bubbling. In other embodiments, a solution comprising the at least one aluminum nitride precursor having the formula described herein is injected into a vaporizer kept at one or more temperatures for direct liquid injection.

A flow of argon and/or other inert gas may be employed as a carrier gas to help deliver the vapor of the at least one metal precursor to the reaction chamber during the precursor pulsing. In certain embodiments, the reaction chamber process pressure is about 2 Torr or less. In other embodiments, the reaction chamber process pressure is about 10 Torr or less.

In a typical PEALD or PECCVD or PEALD-like process, a substrate such as, without limitation, a silicon oxide, carbon doped silicon oxide, flexible substrate, or metal nitride substrate is heated on a heater stage in a reaction chamber that is exposed to the aluminum nitride precursor initially to allow the metal precursor to chemically adsorb onto the surface of the substrate. A purge gas such as nitrogen, argon, or other inert gas purges away unabsorbed excess aluminum from the process chamber. After sufficient purging, a nitrogen-containing source may be introduced into reaction chamber to react with the absorbed surface followed by another gas purge to remove reaction by-products from the chamber. The process cycle can be repeated to achieve the desired film thickness. In other embodiments, pumping under vacuum can be used to remove unabsorbed excess aluminum from the process chamber, after sufficient evacuation under pumping, a nitrogen-containing source may be introduced into reaction chamber to react with the absorbed surface followed by another pumping down purge to remove reaction by-products from the chamber.

In one aspect, there is provided a method for depositing an aluminum doped silicon nitride or gallium doped silicon nitride film via plasma enhanced atomic layer deposition or plasma enhanced ALD-like deposition, the method comprising the steps of:

a. providing a substrate into a reactor;
b. introducing into the reactor an aluminum or gallium precursor selected from the group consisting of $AlCl_3$, trimethylaluminum (TMA), methylaluminum chloride, triethylaluminum, tris(dimethylamino)aluminum (TDMAA), tris(dimethylamino)aluminum (TDMAA), tris(diethylamino)aluminum (TDEAA), gallium chloride, trimethylgallium, triethylgallium, tris(dimethylamino)gallium tris(ethylmethylamino)gallium, tris(diethylamino)gallium under process conditions sufficient to interact with the substrate (e.g., react the aluminum precursor and provide a chemisorbed layer);
c. purge to remove unreacted aluminum precursor;
d. introducing into the reactor a plasma containing source to react with at least a portion of the chemisorbed layer and provide at least one reactive site wherein the plasma is generated at a power density ranging from about 0.01 to about 1.5 W/cm²;
e. purging the reactor with a purge gas;
f. introducing into the reactor an organoaminosilane precursor represented by the following Formulae I through IV below:

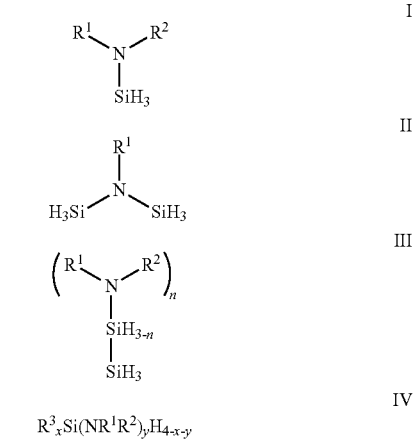

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_1$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group wherein the organoaminosilane precursor interacts with the substrate (e.g., reacts on at least a portion of the surface of the substrate to provide a chemisorbed layer);

g. purging the reactor with a purge gas;

h. introducing a plasma containing source into the reactor to interact (e.g., react) with at least a portion of the chemisorbed layer and provide at least one reactive site wherein the plasma is generated at a power density ranging from about 0.01 to about 1.5 W/cm$^2$; and;

i. optionally purge the reactor with an inert gas; and wherein the steps b through i are repeated until a desired thickness of the film is obtained. In some embodiments, the plasma containing source may be introduced into the reactor in the form of at least one nitrogen source and/or may be present incidentally in the other precursors used in the deposition process. Suitable nitrogen-containing source gases may include, for example, ammonia, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof. In certain embodiments of the method described herein, steps b to i are repeated to provide the film with a thickness ranging from about 0.1 to about 500 Å, or from about 0.1 to about 5 Å, or from about 0.1 to about 10 Å, or about 0.1 to about 50 Å, or 0.1 to 100 Å. In some embodiment, steps b to e can be repeated many times before step f to i create a nanolaminate structure comprising an alternating aluminum nitride and silicon nitride with lower aluminum content (i.e. Al content is 10% or less bases XPS measurement). In this or another embodiment, steps f to i are repeated many times to create nanolaminate structure comprising alternating aluminum nitride and silicon nitride with higher aluminum content (e.g., Al content is 10% or higher bases XPS measurement). In some embodiments, the plasma containing source may be introduced into the reactor in the form of at least one nitrogen source and/or may be present incidentally in the other precursors used in the deposition process. In one particular embodiment of the method described herein, a plasma comprising hydrogen selected from the group consisting of hydrogen plasma, hydrogen/helium, hydrogen/argon plasma, hydrogen/neon plasma and mixtures thereof can be inserted before step d or h to help removing hydrocarbon generated from the reaction between the aluminum or boron precursor and the surface. In an alternative embodiment, the plasma comprises a non-hydrogen plasma. In other embodiments, the aluminum precursor in step b can be replaced with a metal precursor to provide a metal doped silicon and nitrogen containing dielectric film as opposed to conventional metal doped silicon and nitrogen containing conducting film such as TiSiN with less than 10 at. % silicon content deposited from tetrakis(dimethylamino)titanium (TDMAT), silane and ammonia. The metal precursor can be selected from the group consisting of zirconium chloride (ZrCl$_4$, tetrakis(dimethylamino)zirconium (TDMAZ), tetrakis(diethylamino)zirconium (TDEAZ), tetrakis(ethylmethylamino)zirconium (TEMAZ), tris(dimethylamino)(cyclopentadienyl)zirconium, tris(dimethylamino) (methylcyclopentadienyl)zirconium, tris(dimethylamino) (ethylcyclopentadienyl)zirconium, tris(diethylamino) (cyclopentadienyl)zirconium, tris(diethylamino) (methylcyclopentadienyl)zirconium, tris(diethylamino) (ethylcyclopentadienyl)zirconium, tris(ethylmethylamino) (cyclopentadienyl)zirconium, tris(ethylmethylamino) (methylcyclopentadienyl)zirconium, tris(ethylmethylamino) (ethylcyclopentadienyl)zirconium, tetrakis(dimethylamino) hafnium (TDMAH), tetrakis(diethylamino)hafnium (TDEAH), tetrakis(ethylmethylamino)hafnium (TEMAH), tris(dimethylamino)(cyclopentadienyl)hafnium, tris(dimethylamino)(methylcyclopentadienyl)hafnium, tris(dimethylamino)(ethylcyclopentadienyl)hafnium, tris(diethylamino) (cyclopentadienyl)hafnium, tris(diethylamino) (methylcyclopentadienyl)hafnium, tris(diethylamino) (ethylcyclopentadienyl)hafnium, tris(ethylmethylamino) (cyclopentadienyl)hafnium, tris(ethylmethylamino) (methylcyclopentadienyl)hafnium, tris(ethylmethylamino) (ethylcyclopentadienyl)hafnium, Titanium chloride (TiCl$_4$), tetrakis(dimethylamino)titanium (TDMAT), tetrakis(diethylamino)titanium (TDEAT), tetrakis(ethylmethylamino)titanium (TEMAT), tantalum chloride (TaCl$_5$), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, tungsten hexachloride, tungsten pentachloride, bis(tert-butylimino) bis(dimethylamino)tungsten (BTBMW), bis(tert-butylimino)bis(diethylamino)tungsten, bis(tert-butylimino)bis (ethylmethylamino)tungsten, and combinations thereof. In other embodiments, the metal precursor may be introduced into the reactor after organoaminosilane precursor, i.e., the organoaminosilane precursor is introduced in step b while the metal precursor is introduced in step f.

In another aspect, there is provided a method for depositing gallium doped silicon nitride or aluminum doped silicon carbonitride film via plasma enhanced atomic layer deposition or plasma enhanced ALD-like deposition, the method comprising the steps of:

a. providing a substrate in a reactor;

b. introducing into the reactor at least one metal precursor is selected from the group consisting of AlCl$_3$, trimethylaluminum (TMA), triethylaluminum, methylaluminum chloride, tris(dimethylamino)aluminum (TDMAA), tris(dimethylamino)aluminum (TDMAA), tris(diethylamino)aluminum (TDEAA), gallium chloride, trimethylgallium, triethylgallium, tris(dimethylamino)gallium, tris(ethylmethylamino)gallium, tris(diethylamino)gallium and other volatile aluminum or gallium precursors;

c. purge to remove unreacted metal precursor;

d. introducing into the reactor an organoaminosilane precursor represented by the following Formulae I through IV below:

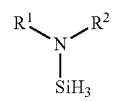

I

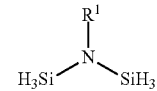

II

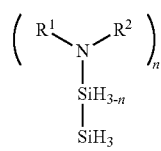

III

IV $R^3_x Si(NR^1R^2)_y H_{4-x-y}$ wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ and $R^3$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0, 1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_1$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group wherein the organoaminosilane precursor interacts (e.g., reacts on) with at least a portion of the surface of the substrate to provide a chemisorbed layer;

e. purging the reactor with a purge gas;

f. introducing a plasma containing source into the reactor to interact (e.g., react) with at least a portion of the chemisorbed layer and provide at least one reactive site wherein the plasma is generated at a power density ranging from about 0.01 to about 1.5 W/cm² and;

g. optionally purge the reactor with an inert gas; and wherein the steps b through g are repeated until a desired thickness of the film is obtained. In some embodiments, the plasma containing source may be introduced into the reactor in the form of at least one nitrogen source and/or may be present incidentally in the other precursors used in the deposition process. Suitable nitrogen-containing source gases may include, for example, ammonia, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF₃ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof. In other embodiments, the metal precursor may be introduced into the reactor after organoaminosilane precursor, i.e., the organoaminosilane precursor is introduced in step b while the metal precursor is introduced in step f.

The above steps define one cycle for the method described herein; and the cycle can be repeated until the desired thickness of the film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and plasma containing source may be performed by varying the duration of the time for supplying them to change the stoichiometric composition of the resulting nitride film, although always using nitrogen in less than a stoichiometric amount relative to the available Group 4, 5, 6, 13 metal or metalloid.

In certain embodiments, the resultant Group 4, 5, 6, 13 metal or metalloid doped silicon nitride films or coatings can be exposed to a post-deposition treatment such as, but not limited to, a plasma treatment, chemical treatment, ultraviolet light exposure, electron beam exposure, and/or other treatments to affect one or more properties of the film. In a still further embodiment of the method described herein, the film or the as-deposited film is subjected to a treatment step. The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film. The films deposited with the silicon precursors having one or two Si—C—Si linkages described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD, such as, without limitation, one (1) ALD cycle, two (2) ALD cycles, five (5) ALD cycles, ten (10) or more ALD cycles, fifty (50) or more, hundred (100) or more, five hundred (500) or more.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $O_2$).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment wherein the film is treated with a plasma, the plasma source is selected from the group consisting of hydrogen plasma, plasma comprising hydrogen and helium, plasma comprising hydrogen and argon, helium plasma, argon plasma, nitrogen plasma, ammonia plasma, and combination thereof.

As mentioned previously, the method described herein may be used to deposit a Group 4, 5, 6, 13 metal or metalloid doped silicon nitride film on at least a portion of a substrate. Examples of suitable substrates include but are not limited to, silicon, germanium, silicon/germanium, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD).

The following examples illustrate the method for depositing Group 4, 5, 6, 13 metal or metalloid doped silicon nitride films described herein and shall not limit the scope of the appended claims.

EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor which has a showerhead design and uses 13.56 MHz direct plasma or the cross flow type CN-1 reactor without plasma (for comparative examples). In typical process conditions, unless stated otherwise, the chamber pressure was fixed at a pressure ranging from about 1 to about 5 torr. Additional inert gas such as argon or nitrogen was used to maintain chamber pressure. The metal precursor was delivered using vapor draw or Ar bubbling, and organoaminosilane precursor was delivered using vapor draw. Typical RF power used was 125 W over electrode area of 150 mm wafer susceptor to provide a power density of 0.7 W/cm$^2$. The film depositions comprised the steps listed in Table 1 for thermal ALD and plasma enhanced ALD (PEALD), respectively.

TABLE 1

Steps used in ALD metal doped silicon nitride dielectric films

| Step | |
|---|---|
| a | Prepare the reactor and load wafer into the reactor chamber |
| b | Introduce a metal precursor to the reactor chamber; additional inert gas is used to maintain chamber pressure to provide a chemisorbed layer |
| c | Purge unreacted metal precursor from the reactor chamber with inert gas |
| d | Introduce plasma source to react with the surface of the chemisorbed layer and create reactive sites |
| e | Purge reaction by-products out |
| f | Introduce an organoaminosilane precursor to the reactor chamber with inert gas |
| g | Purge unreacted organoaminosilane precursor from the reactor chamber with inert gas |
| h | Introduce plasma source or nitrogen source to react with the surface of the chemisorbed layer and create reactive sites |
| i | Purge reaction by-products out |

The reactive index (RI) and thickness for the deposited films were measured using an ellipsometer. Film non-uniformity was calculated using the standard equation: % non-uniformity=((max thickness−min thickness)/(2*average (avg) thickness))×100. Film structure and composition were analyzed using Fourier Transform Infrared (FTIR) spectroscopy, X-Ray Photoelectron Spectroscopy (XPS) and dynamic Secondary Ion Mass Spectrometry (DSIMS). The density for the films was measured with X-ray Reflectivity (XRR).

Comparable Example 1. PEALD Silicon Nitride Film Using Di-Iso-Propylaminosilane (DIPAS) and Nitrogen Plasma The silicon wafer was loaded into the CN-1 reactor equipped with showerhead design with 13.56 MHz direct plasma and heated to 300° C. with chamber pressure of 2 torr. The organoaminosilane precursor di-iso-propylaminosilane (DIPAS) was delivered to the reaction chamber using the vapor draw method. Pattern wafer pieces had an aspect ratio (AR)=12:1 (e.g., AR is defined as depth divided by width of a via or trench; width=~84 nm, depth=~1030 nm) and were employed for testing step coverage. The ALD cycle was comprised of the following process steps:
  a. Prepare the reactor and load wafer
  Chamber pressure: 2 torr
  b. Introduce an organoaminosilane precursor to the reactor
  Total flow of N$_2$: 1000 sccm
  organoaminosilane pulse: 1 second
  c. Purge
  Total flow of N$_2$:1000 sccm
  Purge time: 10 seconds
  d. Introduce plasma
  Total flow of N$_2$: 1000 sccm
  Plasma power: 125 W
  Plasma pulse: 10 seconds
  e. Purge
  Total flow of N$_2$: 1000 sccm
  Purge time: 10 seconds The steps are repeated for 1500 cycle. A transmission electron microscopy (TEM) measurement of a cross-section of the film showed the following thicknesses: silicon nitride on the top=235 Angstroms (Å) corresponding to a silicon nitride growth rate of 0.16 Å/cycle. The step coverage for the resultant silicon nitride was middle 20% and bottom 42%.

Example 1. PEALD Aluminum Doped Silicon Nitride Film Using Trimethylaluminum (TMA), Di-Iso-Propylaminosilane (DIPAS) and Nitrogen Plasma The silicon wafer was loaded into the CN-1 reactor equipped with showerhead design with 13.56 MHz direct plasma and heated to 300° C. with chamber pressure of 2 torr. The precursors, trimethylaluminum (TMA) as the metal precursor and di-iso-propylaminosilane (DIPAS) as organoaminosilane precursor, were delivered using the vapor draw method into the reactor. Nitrogen plasma was used as plasma source. Pattern wafer pieces had an aspect ratio (AR)=13:1 (e.g., AR is defined as depth divided by width of a via or trench; width=80 nm, depth=1050 nm) and were employed for testing step coverage.
  a. Prepare the reactor and load wafer
  Chamber pressure: 2 torr
  b. Introduce an metal precursor to the reactor
  Total flow of N$_2$: 1000 standard cubic centimeters (sccm)
  TMA pulse: 0.1 second
  c. Purge
  Total flow of N$_2$ 1000 sccm
  Purge time: 10 seconds d. Introduce plasma
Total flow of $N_2$: 1000 sccm
Plasma power: 125 W
Plasma pulse: 5 seconds
e. Purge
Total flow of $N_2$: 1000 sccm
Purge time: 10 seconds
f. Introduce an organoaminosilane precursor to the reactor
Total flow of $N_2$: 1000 sccm
DIPAS precursor pulse: 1 second
g. Purge
Total flow of $N_2$:1000 sccm
Purge time: 10 seconds
h. Introduce plasma
Total flow of $N_2$: 1000 sccm
Plasma power: 125 W
Plasma pulse: 10 seconds
i. Purge
Total flow of $N_2$: 1000 sccm
Purge time: 10 seconds In Example 1, steps b to e are repeated 50 times, followed by steps f to i for 1000 cycles (i.e. aluminum nitride: TMA/purge/plasma/purge=0.1 s/10 s/5*s/10 s for 50 cycles; then silicon nitride: DIPAS/purge/plasma/purge=1.0 s/10 s/10*s/10 s for 1000 cycles). A transmission electron microscopy (TEM) measurement of a cross-section of the film showed the following thicknesses: silicon nitride on the top=190 Angstroms (Å) corresponding to a silicon nitride growth rate of about 0.19 Å/cycle and aluminum nitride=18 Å. It seems that aluminum nitride helps slightly to improve the growth rate of silicon nitride, i.e., increasing the growth rate from 0.16 Å to 0.19 Å/cycle. The step coverage for silicon nitride: middle 11% and bottom 32%.

Comparable Example 2a. PEALD Aluminum
Nitride Film Using Trimethylaluminum (TMA) and
Nitrogen Plasma The silicon wafer was loaded into the CN-1 reactor equipped with showerhead design with 13.56 MHz direct plasma and heated to 300° C. with chamber pressure of 2 torr. Trimethylaluminum (TMA) was used as metal precursor and nitrogen plasma was used as plasma source. The ALD cycle was conducted using the following process parameters.
 a. Prepare the reactor and load wafer
 Chamber pressure: 2 torr
 b. Introduce an metal precursor to the reactor
 Total flow of $N_2$: 1000 sccm
 TMA pulse: 0.1 second
 c. Purge
 Total flow of $N_2$:1000 sccm
 Purge time: 10 seconds
 d. Introduce plasma
 Total flow of $N_2$: 1000 sccm
 Plasma power: 125 W
 Plasma pulse: 5 seconds
 e. Purge
 Total flow of $N_2$ 1000 sccm
 Purge time: 10 seconds Steps b to e were repeated for 100 cycles, 200 cycles, and 400 cycles respectively. The growth rate for aluminum nitride was calculated from the graph of thickness vs number of cycles as 0.58 Å/cycle.

Comparable Example 2b. PEALD Silicon Nitride
Film Using Di-Iso-Propylaminosilane (DIPAS) and
Nitrogen Plasma The silicon wafer was loaded into the CN-1 reactor equipped with showerhead design with 13.56 MHz direct plasma and heated to 300° C. with chamber pressure of 2 torr. Di-iso-propylaminosilane (DIPAS) was used as silicon precursor and nitrogen plasma was used as plasma source. The ALD cycle was as following: DIPAS/purge/plasma/purge=1.0 s/10 s/10*s/10 s. The cycles were repeated for 250 cycles, 500 cycles, 1000, and 1500 cycles respectively. The growth rate for silicon nitride was calculated from the graph of thickness vs number of cycles as 0.15 Å/cycle.

Example 2. PEALD Aluminum Doped Silicon
Nitride Film Using Trimethylaluminum (TMA),
Di-Iso-Propylaminosilane (DIPAS), and Nitrogen
Plasma The silicon wafer was loaded into the CN-1 reactor equipped with showerhead design with 13.56 MHz direct plasma and heated to 300° C. with chamber pressure of 2 torr. Trimethylaluminum (TMA) as metal precursor and di-iso-propylaminosilane (DIPAS) as organoaminosilane precursor were delivered using vapor draw method into the reactor. Pattern wafer pieces having AR=13:1 (width=80 nm, depth=1050 nm) was employed for testing step coverage. The ALD cycle was comprised of the process steps provided in Table 1 and using the following process parameters.
 a. Prepare the reactor and load wafer
 Chamber pressure: 2 torr
 b. Introduce an metal precursor to the reactor
 Total flow of $N_2$: 1000 sccm
 TMA pulse: 0.1 second
 c. Purge
 Total flow of $N_2$: 1000 sccm
 Purge time: 10 seconds
 d. Introduce plasma
 Total flow of $N_2$: 1000 sccm
 Plasma power: 125 W
 Plasma pulse: 5 seconds
 e. Purge
 Total flow of $N_2$ 1000 sccm
 Purge time: 10 seconds
 f. Introduce an organoaminosilane precursor to the reactor
 Total flow of $N_2$: 1000 sccm
 DIPAS pulse: 1 second
 g. Purge
 Total flow of $N_2$ 1000 sccm
 Purge time: 10 seconds
 h. Introduce plasma
 Total flow of $N_2$: 1000 sccm
 Plasma power: 125 W
 Plasma pulse: 10 seconds
 i. Purge
 Total flow of $N_2$ 1000 sccm
 Purge time: 10 seconds In this example, one super cycle consisting of aluminum nitride having steps b to e are repeated once, followed by silicon nitride having steps f to i for 20 times (i.e. a super cycle=aluminum nitride: (TMA/purge/plasma/purge=0.1 s/10 s/5*s/10 s)×1 cycle+silicon nitride: (DIPAS/purge/plasma/purge=1.0 s/10 s/10*s/10 s)×20 cycles)). The super cycle is repeated 50 times (i.e. (aluminum nitride: (TMA/purge/plasma/purge=0.1 s/10 s/5*s/10 s)×1 cycle)+silicon nitride: (DIPAS/purge/plasma/purge=1.0 s/10 s/10*s/10 s)×20)×50 cycles. TEM measurement showed the following thicknesses: aluminum doped silicon nitride on the top=270 Å corresponding to a silicon nitride growth rate of about 0.24 Å/cycle assuming 29 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 56% and bottom 67%.

Comparable Example 3a. PEALD Aluminum Nitride Film Using Trimethylaluminum (TMA) and Nitrogen Plasma The silicon wafer was loaded into the CN-1 reactor equipped with showerhead design with 13.56 MHz direct plasma and heated to 300° C. with chamber pressure of 2 torr. Trimethylaluminum (TMA) was used as metal precursor and nitrogen plasma was used as plasma source. The ALD cycle was conducted using the following process parameters.
  a. Prepare the reactor and load wafer
  a. Chamber pressure: 2 torr
  b. Introduce an metal precursor to the reactor
  Total flow $N_2$ flow: 1000 sccm
  TMA pulse: 0.5 second
  c. Purge
  Total flow of $N_2$: 1000 sccm
  Purge time: 10 seconds
  d. Introduce plasma
  Total flow $N_2$ flow: 1000 sccm
  Plasma power: 125 W
  Plasma pulse: 5 seconds
  e. Purge
  Total flow of $N_2$ 1000 sccm
  Purge time: 10 seconds
Steps b to e were repeated for 100 cycles, 200 cycles, and 300 cycles respectively. The growth rate for aluminum nitride was calculated from the graph of thickness vs number of cycles as 0.72 Å/cycle.

Example 3. PEALD Aluminum Doped Silicon Nitride Film Using Trimethylaluminum (TMA) and Di-Iso-Propylaminosilane (DIPAS), and Nitrogen Plasma The silicon wafer was loaded into the CN-1 reactor equipped with showerhead design with 13.56 MHz direct plasma and heated to 300° C. with chamber pressure of 2 torr. Trimethylaluminum (TMA) as metal precursor and di-iso-propylaminosilane (DIPAS) as organoaminosilane precursor were delivered using vapor draw method into the reactor. Nitrogen plasma was used as plasma. Pattern wafer pieces having AR=13:1 (width=80 nm, depth=1050 nm) were employed for testing step coverage. In this experiment, one super cycle consisting of aluminum nitride having steps b to e are repeated once, followed by steps f to i for 10 times (i.e. a super cycle=(aluminum nitride: (TMA/purge/plasma/purge=0.5 s/10 s/5*s/10 s)×1 cycle+silicon nitride: (DIPAS/purge/plasma/purge=1.0 s/10 s/10*s/10 s) for 10 cycles)). The super cycle is repeated 50 times (i.e. (aluminum nitride: (TMA/purge/plasma/purge=0.5 s/10 s/5*s/10 s)×1 cycle+(silicon nitride: (DIPAS/purge/plasma/purge=1.0 s/10 s/10*s/10 s for 10 cycles)×50 cycles). TEM measurement showed the following thicknesses: aluminum doped silicon nitride on the top=175 Å corresponding to a silicon nitride growth rate of about 0.28 Å/cycle assuming 36 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 68% and bottom 82%; this demonstrates that introducing the metal precursor further enhances the step coverage.

The secondary-ion mass spectrometry (SIMS) measurement of deposited aluminum doped silicon nitride shows Si, 31 at %, Al, 8.5 at %, N, 47 at %, C, 2 at %, O, 1.7 at %, and H, 9.5 at %.

Comparable Example 4a. PEALD Aluminum Nitride Film Using Tris(Dimethylamino)Aluminum (TDMAA) and Nitrogen Plasma The silicon wafer was loaded into the CN-1 reactor equipped with showerhead design with 13.56 MHz direct plasma and heated to 300° C. with chamber pressure of 2 torr. Tris(dimethylamino)aluminum (TDMAA) as metal precursor. The ALD cycle was conducted using the following process parameters.
  a. Prepare the reactor and load wafer
  Chamber pressure: 2 torr
  b. Introduce an metal precursor to the reactor
  Total flow $N_2$ flow: 1000 sccm
  TDMAA pulse: 2 seconds
  c. Purge
  Total flow of $N_2$: 1000 sccm
  Purge time: 10 seconds
  d. Introduce plasma
  Total flow $N_2$ flow: 1000 sccm
  Plasma power: 125 W
  Plasma pulse: 5 seconds
  e. Purge
  Total flow of $N_2$ 1000 sccm
  Purge time: 10 seconds
Steps b to e were repeated for 100 cycles, 200 cycles, and 300 cycles respectively. The growth rate for aluminum nitride was calculated from the graph of thickness vs number of cycles as 0.60 Å/cycle.

Example 4. PEALD Aluminum Doped Silicon Nitride Film Using Tris(Dimethylamino)Aluminum (TDMAA) and Di-Iso-Propylaminosilane (DIPAS), and Nitrogen Plasma The silicon wafer was loaded into the CN-1 reactor equipped with showerhead design with 13.56 MHz direct plasma and heated to 300° C. with chamber pressure of 2 torr. Tris(dimethylamino)aluminum (TDMAA) as metal precursor and di-iso-propylaminosilane (DIPAS) as organoaminosilane precursor were delivered using vapor draw method into the reactor. Nitrogen plasma was used for plasma. Pattern wafer pieces having AR=12:1 (width=84 nm, depth=1030 nm) were employed for testing step coverage. In this experiment, one super cycle consisting of aluminum nitride having steps b to e are repeated once, followed by steps f to i for 10 times (i.e. a super cycle=(aluminum nitride: (TDMAA/purge/plasma/purge=2 s/10 s/5*s/10 s)×1 cycle+silicon nitride: (DIPAS/purge/plasma/purge=1.0 s/10 s/10*s/10 s for 10 cycles). The super cycle is repeated 100 times (i.e. (aluminum nitride: (TMA/purge/plasma/purge=2 s/10 s/5*s/10 s)×1 cycle+silicon nitride: (DIPAS/purge/plasma/purge=1.0 s/10 s/10*s/10 s for 10 cycles))×100 cycles. Referring now to FIG. 1, TEM measurement (FIG. 1)

showed the following thicknesses: aluminum doped silicon nitride on the top=320 Å corresponding to a silicon nitride growth rate of about 0.26 Å/cycle assuming 60 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 69% and bottom 78% also demonstrates that introducing metal precursor further enhances the step coverage.

Comparable Example 5a. PEALD Aluminum Nitride Film Using Tris(Dimethylamino)Aluminum (TDMAA) and Ammonia Plasma The silicon wafer was loaded into the CN-1 reactor equipped with showerhead design with 13.56 MHz direct plasma and heated to 300° C. with chamber pressure of 2 torr. Tris(dimethylamino)aluminum (TDMAA) as metal precursor ammonia plasma was used as plasma source. The ALD cycle was conducted using the following process parameters.
  a. Prepare the reactor and load wafer
  Chamber pressure: 2 torr
  b. Introduce an metal precursor to the reactor
  Total flow argon flow: 1050 sccm
  TDMAA pulse: 2 seconds
  c. Purge
  Total flow of argon: 1000 sccm
  Purge time: 20 seconds
  d. Introduce plasma
  Total flow of argon: 1000 sccm
  Flow of ammonia: 300 sccm
  Plasma power: 125 W
  Plasma pulse: 5 seconds
  e. Purge
  Total flow of argon: 1000 sccm
  Purge time: 20 seconds
Steps b to e were repeated for 100 cycles, 200 cycles, and 300 cycles respectively. The growth rate for aluminum nitride was calculated from the graph of thickness vs number of cycles as 0.74 Å/cycle.

Comparable Example 5b. PEALD Silicon Nitride Film Using Di-Iso-Propylaminosilane (DIPAS) and Ammonia Plasma The silicon wafer was loaded into the CN-1 reactor equipped with showerhead design with 13.56 MHz direct plasma and heated to 300° C. with chamber pressure of 2 torr. di-iso-propylaminosilane (DIPAS) as organoaminosilane precursor and ammonia plasma was used as plasma source. The cycle consisting of DIPAS/purge/plasma/purge=1.0 s/10 s/10*s/15 s was repeated for 500 cycles to provide 23 Å corresponding to a silicon nitride growth rate of about 0.046 Å/cycle.

Example 5. PEALD Aluminum Doped Silicon Nitride Film Using Tris(Dimethylamino)Aluminum (TDMAA), Di-Iso-Propylaminosilane (DIPAS), and Ammonia Plasma The silicon wafer was loaded into the CN-1 reactor equipped with showerhead design with 13.56 MHz direct plasma and heated to 300° C. with chamber pressure of 2 torr. Tris(dimethylamino)aluminum (TDMAA) as metal precursor and di-iso-propylaminosilane (DIPAS) as organoaminosilane precursor were delivered using vapor draw method into the reactor. Ammonia plasma was used for plasma. Pattern wafer pieces having AR=14:1 (width=78 nm, depth=1020 nm) were employed for testing step coverage. In this experiment, one super cycle consisting of aluminum nitride having steps b to e in Table 1 are repeated once, followed by steps f to i in Table 1 for 10 times (i.e. a super cycle=(aluminum nitride: (TDMAA/purge/plasma/purge=2 s/20 s/5*s/20 s)×1 cycle+silicon nitride: (DIPAS/purge/plasma/purge=1.0 s/10 s/10*s/15 s for 30 cycles).

The super cycle is repeated 100 times (i.e. (aluminum nitride: (TDMAA/purge/plasma/purge=2 s/20 s/5*s/20 s)×1 cycle+silicon nitride: (DIPAS/purge/plasma/purge=1.0 s/10 s/10*s/15 s for 30 cycles))×50 cycles. TEM measurement showed the following thicknesses: aluminum doped silicon nitride on the top=160 Å corresponding to a silicon nitride growth rate of about 0.08 Å/cycle assuming 38 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 69% and bottom 69% also demonstrates that introducing aluminum precursor further enhances the step coverage. The secondary-ion mass spectrometry (SIMS) measurement of deposited aluminum doped silicon nitride shows Si, 21.2 at %, Al, 2.6 at %, N, 42 at %, C, 0.01 at %, O, 5.5 at %, H, 18.6 at %.

Comparable Example 6a. PEALD Silicon Nitride Film Using Bis(Tert-Butylamino)Silane (BTBAS) and Nitrogen Plasma The silicon wafer was loaded into the CN-1 reactor equipped with showerhead design with 13.56 MHz direct plasma and heated to 300° C. with chamber pressure of 2 torr. Bis(tert-butylamino)silane (BTBAS) as organoaminosilane precursor ammonia plasma was used as plasma source. The cycle consisting of BTBAS/purge/plasma/purge=1.0 s/10 s/10*s/10 s was repeated for 500, 1000, and 1500 cycles respectively. The growth rate for aluminum nitride was calculated from the graph of thickness vs number of cycles as 0.28 Å/cycle.

Figure 2:
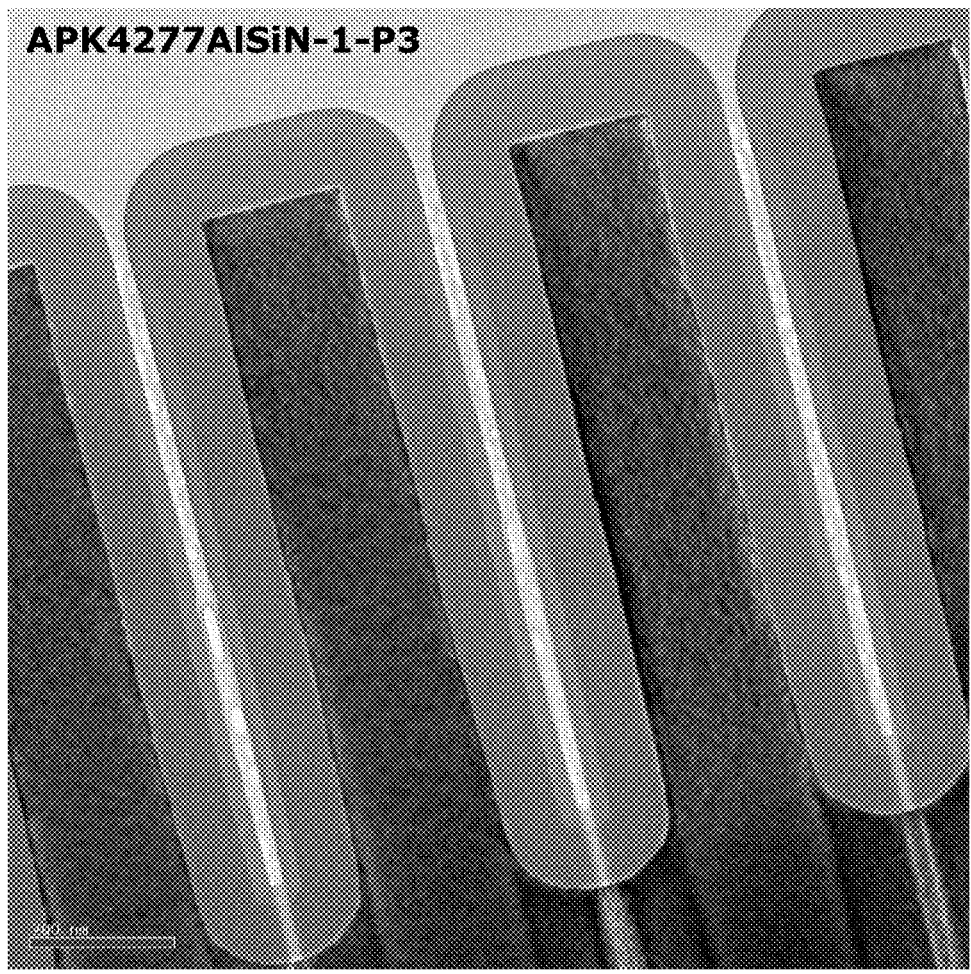
FIG. 2 provides a transmission electron microscope (TEM) image of AlSiN film deposited using trimethylaluminum, bis(tert-butylamino)silane and nitrogen plasma as described in Example 6, which shows the following step coverage: middle 81% and bottom 94%.

Example 6. PEALD Aluminum Doped Silicon Nitride Film Using Trimethylaluminum (TMA), Bis(Tert-Butylamino)Silane (BTBAS), and Nitrogen Plasma The silicon wafer was loaded into the CN-1 reactor equipped with showerhead design with 13.56 MHz direct plasma and heated to 300° C. with chamber pressure of 2 torr. Trimethylaluminum (TMA) as metal precursor and bis(tert-butylamino)silane (BTBAS) as organoaminosilane precursor were delivered using vapor draw method into the reactor. Pattern wafer pieces having AR=14:1 (width=74 nm, depth=1006 nm) were employed for testing step coverage. In this experiment, one super cycle consisting of aluminum nitride having steps b to e in Table 1 were repeated once, followed by steps f to i in Table 1 for 10 times (i.e. a super cycle=(aluminum nitride: (TMA/purge/plasma/purge=0.5 s/10 s/5*s/10 s)×1 cycle+silicon nitride: (BTBAS/purge/plasma/purge=1.0 s/10 s/10*s/10 s for 10 cycles). The super cycle is repeated 90 times (i.e. (aluminum nitride: (TMA/purge/plasma/purge=0.5 s/10 s/5*s/10 s)×1 cycle+silicon nitride: (BTBAS/purge/plasma/purge=1.0 s/10 s/10*s/10 s for 10 cycles))×70 cycles. Referring now to FIG. 2, TEM measurement (FIG. 2) showed the following thicknesses: aluminum doped silicon nitride on the top=320

Å corresponding to a silicon nitride growth rate of about 0.39 Å/cycle assuming 50 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 81% and bottom 94% also demonstrates that introducing TMA further enhances the step coverage. The secondary-ion mass spectrometry (SIMS) measurement of deposited aluminum doped silicon nitride shows Si, 33.3 at %, Al, 7.1 at %, N, 45.2 at %, C, 2.4 at %, O, 0.7 at %, H, 11.3 at %.

Comparable Example 7a. PEALD Aluminum Nitride Film Using Trimethylaluminum (TMA) and Ammonia Plasma The silicon wafer was loaded into the CN-1 reactor equipped with showerhead design with 13.56 MHz direct plasma and heated to 300° C. with chamber pressure of 2 torr. Trimethylaluminum (TMA) was used as metal precursor and ammonia plasma was used as plasma source. The ALD cycle was conducted using the following process parameters.
  a. Prepare the reactor and load wafer
  a. Chamber pressure: 2 torr
  b. Introduce an metal precursor to the reactor
  Total flow argon flow: 1000 sccm
  TMA pulse: 0.5 seconds
  c. Purge
  Total flow of argon: 1000 sccm
  Purge time: 10 seconds
  d. Introduce plasma
  a. Total flow of argon: 1000 sccm
    Flow of ammonia: 500 sccm
    Plasma power: 125 W
    Plasma pulse: 5 seconds
  e. Purge
  Total flow of argon: 1000 sccm
  Purge time: 10 seconds
Steps b to e were repeated for 200 cycles and 300 cycles respectively. The growth rate for aluminum nitride was calculated from the graph of thickness vs number of cycles as 1.21 Å/cycle.

Comparable Example 7b. PEALD Silicon Nitride Film Using Bis(Tert-Butylaminosilane (BTBAS) and Ammonia Plasma The silicon wafer was loaded into the CN-1 reactor equipped with showerhead design with 13.56 MHz direct plasma and heated to 300° C. with chamber pressure of 2 torr. Bis(tert-butylaminosilane (BTBAS) was used as organoaminosilane precursor and ammonia plasma was used as plasma source. The cycle consisting of BTBAS/purge/plasma/purge=1.0 s/10 s/10*s/15 s was repeated for 500, 1000, and 1500 cycles. The growth rate for silicon nitride was calculated from the graph of thickness vs number of cycles as 0.045 Å/cycle.

Example 7. PEALD Aluminum Doped Silicon Nitride Film Using Trimethylaluminum (TMA), Bis(Tert-Butylamino)Silane (BTBAS), and Ammonia Plasma The silicon wafer was loaded into the CN-1 reactor equipped with showerhead design with 13.56 MHz direct plasma and heated to 300° C. with chamber pressure of 2 torr. Trimethylaluminum (TMA) as metal precursor and bis(tert-butylamino)silane (BTBAS) as organoaminosilane precursor were delivered using vapor draw method into the reactor. Ammonia plasma was used as plasma. Pattern wafer pieces having AR=14:1 (width=74 nm, depth=1006 nm) were employed for testing step coverage. In this experiment, one super cycle consisting of aluminum nitride having steps b to e in Table 1 are repeated once, followed by steps f to i in Table 1 for 10 times (i.e. a super cycle=(aluminum nitride: (TMA/purge/plasma/purge=0.5 s/10 s/5*s/10 s)×1 cycle+silicon nitride: (BTBAS/purge/plasma/purge=1.0 s/10 s/10*s/10 s for 20 cycles). The super cycle is repeated 45 times (i.e. (aluminum nitride: (TMA/purge/plasma/purge=0.5 s/10 s/5*s/10 s)×1 cycle+silicon nitride: (BTBAS/purge/plasma/purge=1.0 s/10 s/10*s/10 s for 20 cycles))×45 cycles. TEM measurement showed the following thicknesses: aluminum doped silicon nitride on the top=160 Å corresponding to a silicon nitride growth rate of about 0.12 Å/cycle assuming 55 Å aluminum nitride, demonstrating significant improvement of growth rate of silicon nitride via alternating deposition of aluminum nitride and silicon nitride, i.e. deposited aluminum nitride layer boosts deposition of silicon nitride. The step coverage: middle 88% and bottom 91% also demonstrates that introducing TMA further enhances the step coverage.

Comparable Example 8a. PEALD Silicon Nitride Film Using Di-Iso-Propylaminodisilane (DIPADS) and Nitrogen Plasma The silicon wafer was loaded into the CN-1 reactor equipped with showerhead design with 13.56 MHz direct plasma and heated to 300° C. with chamber pressure of 2 torr. Di-iso-propylaminodisilane (DIPADS) was used as silicon precursor and nitrogen plasma as plasma. The ALD cycle was as following: DIPADS/purge/plasma/purge=1.0 s/10 s/15*s/5 s. The cycles were repeated for 250 cycles, 500 cycles, and 750 cycles respectively. The growth rate for silicon nitride was calculated from the graph of thickness vs number of cycles as 0.38 Å/cycle.

Comparable Example 8b. PEALD Gallium Nitride Film Using Trimethylgallium (TMGa) and Nitrogen Plasma The silicon wafer was loaded into the CN-1 reactor equipped with showerhead design with 13.56 MHz direct plasma and heated to 300° C. with chamber pressure of 2 torr. Trimethylgallium was used as gallium precursor and nitrogen plasma was used as plasma. The ALD cycle was as following: TMGa/purge/plasma/purge=0.5 s/10 s/15*s/5 s. The cycles were repeated for 100 cycles, 200 cycles, and 400 cycles respectively. The growth rate for gallium nitride was calculated from the graph of thickness vs number of cycles as 0.42 Å/cycle.

Example 8. PEALD Gallium Doped Silicon Nitride Film Using Trimethylgallium (TMGa), Di-Iso-Propylaminodisilane (DIPADS), and Nitrogen Plasma The silicon wafer was loaded into the CN-1 reactor equipped with showerhead design with 13.56 MHz direct plasma and heated to 300° C. with chamber pressure of 2 torr. Trimethylgallium (TMGa) as metal precursor and di-iso-propylaminodisilane (DIPADS) as organoaminosilane precursor were delivered using vapor draw method into the reactor. In this experiment, one super cycle consisting of gallium nitride having steps b to e in Table 1 are repeated once, followed by steps f to i in Table 1 for 20 times (i.e. a super cycle=(gallium nitride: (TMGa/purge/plasma/purge=0.5 s/10 s/15*s/5 s)×1 cycle+silicon nitride: (DIPADS/purge/plasma/purge=1.0 s/10 s/15*s/5 s for 20 cycles). The super cycle is repeated 25 times (i.e. (gallium nitride: (TMGa/purge/plasma/purge=0.5 s/10 s/15*s/5 s)×1 cycle+silicon nitride: (DIPADS/purge/plasma/purge=1.0 s/10 s/15*s/5 s for 20 cycles))×25 cycles. TEM measurement showed the following thicknesses: gallium doped silicon nitride=250 Å corresponding to a silicon nitride growth rate of about 0.48 Å/cycle (about 28% increase compare to PEALD silicon nitride using only DIPADS) assuming 11 Å gallium nitride, demonstrating significant improvement of growth rate of silicon nitride via alternating deposition of gallium nitride and silicon nitride, i.e. deposited gallium nitride layer boosts deposition of silicon nitride. In another experiment, one super cycle consisting of gallium nitride having steps b to e in Table 1 are repeated once, followed by steps f to i in Table 1 for 5 times (i.e. a super cycle=(gallium nitride: (TMGa/purge/plasma/purge=0.5 s/10 s/15*s/5 s)×1 cycle+silicon nitride: (DIPADS/purge/plasma/purge=1.0 s/10 s/15*s/5 s for 5 cycles). The super cycle is repeated 100 times (i.e. (gallium nitride: (TMGa/purge/plasma/purge=0.5 s/10 s/15*s/5 s)×1 cycle+silicon nitride: (DIPADS/purge/plasma/purge=1.0 s/10 s/15*s/5 s for 5 cycles))×100 cycles. TEM measurement showed the following thicknesses: gallium doped silicon nitride=320 Å corresponding to a silicon nitride growth rate of about 0.56 Å/cycle (about 47% increase compare to PEALD silicon nitride using only DIPADS) assuming 42 Å gallium nitride, demonstrating significant improvement of growth rate of silicon nitride via alternating deposition of gallium nitride and silicon nitride, i.e. deposited gallium nitride layer boosts deposition of silicon nitride significantly.

Comparable Example 9a. PEALD Titanium Nitride Film Using Tetrakis(Dimethylamino)Titanium (TDMAT) and Nitrogen Plasma The silicon wafer was loaded into the CN-1 reactor equipped with showerhead design with 13.56 MHz direct plasma and heated to 300° C. with chamber pressure of 2 torr. TDMAT was used as titanium precursor and nitrogen plasma was used as plasma source. The ALD cycle was as following: TDMAT/purge/plasma/purge=1 s/20 s/5*s/10 s. The cycles were repeated for 50 cycles, 100 cycles, and 200 cycles respectively. The growth rate for titanium nitride was calculated from the graph of thickness vs number of cycles as 1.11 Å/cycle.

Example 9. PEALD Titanium Doped Silicon Nitride Film Using Tetrakis(Dimethylamino)Titanium (TDMAT), Di-Iso-Propylaminosilane (DIPAS), and Nitrogen Plasma The silicon wafer was loaded into the CN-1 reactor equipped with showerhead design with 13.56 MHz direct plasma and heated to 300° C. with chamber pressure of 2 torr. tetrakis(dimethylamino)titanium (TDMAT) as metal precursor and di-iso-propylaminosilane (DIPAS) as organoaminosilane precursor were delivered using Ar bubbling (Ar flow rate=50 sccm), and vapor draw method, respectively, into the reactor. In this experiment, one super cycle consisting of titanium nitride having steps b to e in Table 1 are repeated twice, followed by steps f to i in Table 1 for 20 times (i.e. a super cycle=(titanium nitride: (TDMAT/purge/plasma/purge=1 s/20 s/5*s/10 s)×2 cycle+silicon nitride: (DIPAS/purge/plasma/purge=1.0 s/10 s/10*s/10 s for 20 cycles). The super cycle is repeated 40 times (i.e. (titanium nitride: (TDMAT/purge/plasma/purge=1 s/20 s/5*s/10 s)×2 cycle+silicon nitride: (DIPAS/purge/plasma/purge=1.0 s/10 s/10*s/10 s for 20 cycles))×40 cycles. TEM measurement showed the following thicknesses: titanium doped silicon nitride=230 Å corresponding to a silicon nitride growth rate of about 0.24 Å/cycle based on XRF measurement of 36 Å of titanium nitride, demonstrating significant improvement of growth rate of silicon nitride via alternating deposition of titanium nitride and silicon nitride, i.e. deposited titanium nitride layer boosts deposition of silicon nitride. In another experiment, one super cycle consisting of titanium nitride having steps b to e in Table 1 are repeated 3 times, followed by steps f to i in Table 1 for 20 times (i.e. a super cycle=(titanium nitride: (TDMAT/purge/plasma/purge=1 s/20s/5*s/10s)×3 cycle+silicon nitride: (DIPAS/purge/plasma/purge=1.0 s/10 s/10*s/10 s for 20 cycles). The super cycle is repeated 40 times (i.e. (titanium nitride: (TDMAT/purge/plasma/purge=1 s/20 s/5*s/10 s)×3 cycle+silicon nitride: (DIPAS/purge/plasma/purge=1.0 s/10 s/10*s/10 s for 20 cycles))×40 cycles. TEM measurement showed the following thicknesses: titanium doped silicon nitride=285 Å corresponding to a silicon nitride growth rate of about 0.28 Å/cycle (about 26% increase compare to PEALD silicon nitride using only DIPAS) based on XRF measurement of 65 Å of titanium nitride, demonstrating significant improvement of growth rate of silicon nitride via alternating deposition of titanium nitride and silicon nitride, i.e. deposited titanium nitride layer boosts deposition of silicon nitride significantly.

Example 10. PEALD Titanium Doped Silicon Nitride Film Using Tetrakis(Dimethylamino)Titanium (TDMAT), Bis(Tert-Butylamino)Silane (BTBAS), and Nitrogen Plasma The silicon wafer was loaded into the CN-1 reactor equipped with showerhead design with 13.56 MHz direct plasma and heated to 300° C. with chamber pressure of 2 torr. tetrakis(dimethylamino)titanium (TDMAT) as metal precursor and di-bis(tert-butylamino)silane (BTBAS) as organoaminosilane precursor were delivered using Ar bubbling (Ar flow rate=50 sccm), and vapor draw method, respectively, into the reactor. In this experiment, one super cycle consisting of titanium nitride having steps b to e in Table 1 are repeated twice, followed by steps f to i in Table 1 for 20 times (i.e. a super cycle=(titanium nitride: (TDMAT/purge/plasma/purge=1 s/20 s/5*s/10 s)×2 cycle+silicon nitride: (BTBAS/purge/plasma/purge=1.0 s/10 s/10*s/10 s for 20 cycles). The super cycle is repeated 40 times (i.e. (titanium nitride: (TDMAT/purge/plasma/purge=1 s/20 s/5*s/10 s)×2 cycle+silicon nitride: (BTBAS/purge/plasma/purge=1.0 s/10 s/10*s/10 s for 20 cycles))×40 cycles. TEM measurement showed the following thicknesses: titanium doped silicon nitride=265 Å corresponding to a silicon nitride growth rate of about 0.29 Å/cycle (about 26% increase compare to PEALD silicon nitride using only BTBAS) based on XRF measurement of 35 Å of titanium nitride, demonstrating significant improvement of growth rate of silicon nitride via alternating deposition of titanium nitride and silicon nitride, i.e. deposited titanium nitride layer boosts deposition of silicon nitride. In another experiment, one super cycle consisting of titanium nitride having steps b to e in Table 1 are repeated 3 times, followed by steps f to i in Table 1 for 20 times (i.e. a super cycle=(titanium nitride: (TDMAT/purge/plasma/purge=1 s/20 s/5*s/10 s)×3 cycle+silicon nitride: (BTBAS/purge/plasma/purge=1.0 s/10 s/10*s/10 s for 20 cycles). The super cycle is repeated 40 times (i.e. (titanium nitride: (TDMAT/purge/plasma/purge=1 s/20 s/5*s/10 s)×3 cycle+silicon nitride: (BTBAS/purge/plasma/purge=1.0 s/10 s/10*s/10 s for 20 cycles))×40 cycles. TEM measurement showed the following thicknesses: titanium doped silicon nitride=305 Å corresponding to a silicon nitride growth rate of about 0.30 Å/cycle ((about 30% increase compare to PEALD silicon nitride using only BTBAS) based on XRF measurement of 62 Å of titanium nitride, demonstrating significant improvement of growth rate of silicon nitride via alternating deposition of titanium nitride and silicon nitride, i.e. deposited titanium nitride layer boosts deposition of silicon nitride significantly.

While the invention has been described with reference to certain aspects or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to a particular embodiment, but that the invention will include all embodiments falling within the scope of the appended claims.

The invention claimed is:

1. A method for depositing a conformal metal doped silicon nitride film in a vapor deposition method, the method comprising the steps of:
   a. providing a substrate into a reactor;
   b. introducing into the reactor a metal precursor under process conditions sufficient to interact the metal precursor with the substrate, wherein the metal precursor comprises zirconium, hafnium, titanium, tantalum, or tungsten;
   c. purge to remove unreacted metal precursor;
   d. introducing into the reactor a plasma containing source to interact with at least a portion of the substrate and provide at least one reactive site wherein the plasma is generated at a power density ranging from about 0.01 to about 1.5 W/cm$^2$;
   e. purging the reactor with a purge gas;
   f. introducing into the reactor an organoaminosilane precursor represented by the following Formulae I through IV

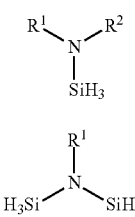

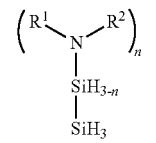

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ and $R^3$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0,1, 2; y=2, 3;
and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_2$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group wherein the organoaminosilane precursor interacts with at least a portion of the surface of the substrate;
   g. purging the reactor with a purge gas;
   h. introducing the plasma containing source into the reactor to react with at least a portion of the chemisorbed layer and provide at least one reactive site wherein the plasma is generated at a power density ranging from about 0.01 to about 1.5 W/cm$^2$; and;
   i. optionally purge the reactor with an inert gas; and wherein the steps b through i are repeated until a desired thickness of the film is obtained.

2. The method of claim 1, wherein the at least one organoaminosilane precursor is at least one member selected from the group consisting of di-iso-propylaminosilane, di-sec-butylaminosilane, phenylmethylaminosilane, 2,6-dimethylpiperidinosilane, N-methylcyclohexylaminosilane, N-ethylcyclohexylaminosilane, N-isopropylcyclohexylaminosilane, 2-methylpiperidinosilane, N-silyldecahydroquinoline, 2,2,6,6-tetramethylpiperidinosilane, 2-(N-silylmethylamino)pyridine, N-t-butyldisilazane, N-t-pentyldisilazane, N-(3-methyl-2-pyridyl)disilazane, N-(2-methylphenyl)disilazane, N-(2-ethylphenyl)disilazane, N-(2,4,6-trimethylphenyl)disilazane, N-(2,6-di-iso-pripylphenyl)disilazane, di-iso-propylaminodisilane, di-iso-butylaminodisilane, di-sec-butylaminodisilane, 2,6-dimethylpiperidinosilane, N-methylcyclohexylaminodisilane, N-ethylcyclohexylaminodisilane, phenylmethylaminodisilane, 2-(N-disilylmethylamino)pyridine, N-phenylethyldisilane, N-isopropylcyclohexylaminodisilane, 1,1-(N,N'-di-tert-butylethylenediamino)disilane, bis(iso-propylamino)methylsilane, bis(iso-butylamino)methylsilane, bis(sec-butylamino)methylsilane, bis(tert-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, and bis(cyclohexylamino)dimethylsilane, bis(dimethylamino)silane, bis(diethylamino)silane, bis(ethylmethylamino)silane, bis(tert-butylamino)silane, tris(dimethylamino)silane, tris(iso-propylamino)silane, trisilylamine, and trisilylamine derivatives.

3. The method of claim 1, the plasma containing source is at least one member selected from the group consisting of a nitrogen and argon plasma, a nitrogen and helium plasma, an ammonia plasma, a nitrogen and ammonia plasma, an ammonia and helium plasma, an ammonia and argon plasma, a $NF_3$ containing plasma, an organoamine containing plasma, and mixtures thereof.

4. The method of claim 1, wherein the film has a density of about 2.0 g/cc or greater.

5. The method of claim 1, wherein the method is a vapor deposition process and is selected from the group consisting of at least one selected from plasma enhanced chemical vapor deposition and plasma enhanced cyclic chemical vapor deposition.

6. The method of claim 1, wherein the method is conducted at one or more temperatures of about 500° C. or less.

7. The method of claim 1, wherein the method is conducted at one or more temperatures of about 400° C. or less.

8. The method of claim 1, wherein the method is conducted at one or more temperatures of about 300° C. or less.

9. A method of forming a conformal metal doped silicon nitride or conformal metal doped silicon carbonitride film, the method comprising the steps of:
 a. providing a substrate in a reactor;
 b. introducing into the reactor at least one precursor, wherein the at least one precursor comprises zirconium, hafnium, titanium, tantalum, or tungsten;
 c. purge to remove unreacted precursor;
 d. introducing into the reactor an organoaminosilane precursor represented by the following Formulae I through IV below:

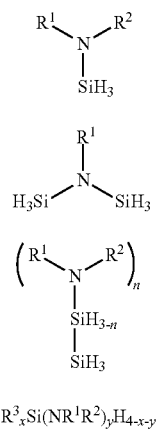

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ and $R^3$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0,1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_1$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group wherein the organoaminosilane precursor reacts on at least a portion of the surface of the substrate to provide a chemisorbed layer;
 e. purging the reactor with a purge gas;
 f. introducing a plasma containing source into the reactor to react with at least a portion of the chemisorbed layer and provide at least one reactive site wherein the plasma is generated at a power density ranging from about 0.01 to about 1.5 W/cm² and;
 g. optionally purge the reactor with an inert gas; and wherein the steps b through g are repeated until a desired thickness of the film is obtained.

10. The method of claim 9, wherein the at least one organoaminosilane precursor is selected from the group consisting of di-iso-propylaminosilane, di-sec-butylaminosilane, phenylmethylaminosilane, 2,6-dimethylpiperidinosilane, N-methylcyclohexylaminosilane, N-ethylcyclohexylaminosilane, N-isopropylcyclohexylaminosilane, 2-methylpiperidinosilane, N-silyldecahydroquinoline, 2,2,6,6-tetramethylpiperidinosilane, 2-(N-silylmethylamino)pyridine, N-t-butyldisilazane, N-t-pentyldisilazane, N-(3-methyl-2-pyridyl)disilazane, N-(2-methylphenyl)disilazane, N-(2-ethylphenyl)disilazane, N-(2,4,6-trimethylphenyl)disilazane, N-(2,6-di-iso-pripylphenyl)disilazane, di-iso-propylaminodisilane, di-iso-butylaminodisilane, di-sec-butylaminodisilane, 2,6-dimethylpiperidinosilane, N-methylcyclohexylaminodisilane, N-ethylcyclohexylaminodisilane, phenylmethylaminodisilane, 2-(N-disilylmethylamino)pyridine, N-phenylethyldisilane, N-isopropylcyclohexylaminodisilane, 1,1-(N,N'-di-tert-butylethylenediamino)disilane, bis(iso-propylamino)methylsilane, bis(iso-butylamino)methylsilane, bis(sec-butylamino)methylsilane, bis(tert-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, and bis(cyclohexylamino)dimethylsilane, bis(dimethylamino)silane, bis(diethylamino)silane, bis(ethylmethylamino)silane, bis(tert-butylamino)silane, tris(dimethylamino)silane, tris(iso-propylamino)silane, and trisilylamine.

11. A method for depositing a conformal metal doped silicon nitride dielectric film via thermal atomic layer deposition at temperature below 500° C., the method comprising the steps of:
 a. providing a substrate into a reactor;
 b. introducing into the reactor a metal precursor under process conditions sufficient to react the metal precursor and provide a chemisorbed layer, wherein the metal precursor comprises zirconium, hafnium, titanium, tantalum, or tungsten;
 c. purge to remove unreacted metal precursor;
 d. introducing into the reactor a nitrogen source to react with at least a portion of the chemisorbed layer and provide at least one reactive site;
 e. purging the reactor with a purge gas;

f. introducing into the reactor an organoaminosilane precursor represented by the following Formulae I through IV below:

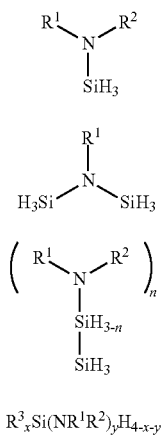

wherein $R^1$ is selected from a linear $C_1$ to $C_{10}$ alkyl group, a branched $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, a $C_6$ to $C_{10}$ aryl group, a $C_1$ to $C_{10}$ alkyl silyl group, and a silyl group; $R^2$ is selected from hydrogen, a linear $C_2$ to $C_{10}$ alkyl group, a branched $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, and a $C_4$ to $C_{10}$ aryl group; n=1 or 2; x=0,1, 2; y=2, 3; and optionally wherein $R^1$ and $R^2$ in Formulae I, III and IV are linked together to form a ring selected from a substituted or unsubstituted aromatic ring or a substituted or unsubstituted aliphatic ring; $R^3$ is selected from a linear $C_1$ to $C_{10}$ alkyl group, a branched $C_3$ to $C_{10}$ alkyl group, a linear or branched $C_2$ to $C_{10}$ alkenyl group, a linear or branched $C_2$ to $C_{10}$ alkynyl group wherein the organoaminosilane precursor reacts on at least a portion of the surface of the substrate to provide a chemisorbed layer;

g. purging the reactor with a purge gas;

h. introducing a plasma source comprising nitrogen into the reactor to react with at least a portion of the chemisorbed layer and provide at least one reactive site; and i. optionally purge the reactor with an inert gas.

12. The method of claim 11, wherein the at least one organoaminosilane precursor is selected from the group consisting of di-iso-propylaminosilane, di-sec-butylaminosilane, phenylmethylaminosilane, 2,6-dimethylpiperidinosilane, N-methylcyclohexylaminosilane, N-ethylcyclohexylaminosilane, N-isopropylcyclohexylaminosilane, 2-methylpiperidinosilane, N-silyldecahydroquinoline, 2,2,6,6-tetramethylpiperidinosilane, 2-(N-silylmethylamino)pyridine, N-t-butyldisilazane, N-t-pentyldisilazane, N-(3-methyl-2-pyridyl)disilazane, N-(2-methylphenyl)disilazane, N-(2-ethylphenyl)disilazane, N-(2,4,6-trimethylphenyl)disilazane, N-(2,6-di-iso-pripylphenyl)disilazane, di-iso-propylaminodisilane, di-iso-butylaminodisilane, di-sec-butylaminodisilane, 2,6-dimethylpiperidinodisilane, N-methylcyclohexylaminodisilane, N-ethylcyclohexylaminodisilane, phenylmethylaminodisilane, 2-(N-disilylmethylamino)pyridine, N-phenylethyldisilane, N-isopropylcyclohexylaminodisilane, 1,1-(N,N'-di-tert-butylethylenediamino)disilane, bis(iso-propylamino)methylsilane, bis(iso-butylamino)methylsilane, bis(sec-butylamino)methylsilane, bis(tert-butylamino)methylsilane, bis(tert-pentylamino)methylsilane, bis(cyclohexylamino)methylsilane, bis(iso-propylamino)dimethylsilane, bis(iso-butylamino)dimethylsilane, bis(sec-butylamino)dimethylsilane, bis(tert-butylamino)dimethylsilane, bis(tert-pentylamino)dimethylsilane, and bis(cyclohexylamino)dimethylsilane, bis(dimethylamino)silane, bis(diethylamino)silane, bis(ethylmethylamino)silane, bis(tert-butylamino)silane, tris(dimethylamino)silane, tris(iso-propylamino)silane, trisilylamine, and trisilylamine derivatives.

13. The method of claim 11, wherein the at least one metal precursor is selected from the group consisting of zirconium chloride ($ZrCl_4$), tetrakis(dimethylamino)zirconium (TDMAZ), tetrakis(diethylamino)zirconium (TDEAZ), tetrakis(ethylmethylamino)zirconium (TEMAZ), tris(dimethylamino)(cyclopentadienyl)zirconium, tris(dimethylamino)(methylcyclopentadienyl)zirconium, tris(dimethylamino)(ethylcyclopentadienyl)zirconium, tris(diethylamino)(cyclopentadienyl)zirconium, tris(diethylamino)(methylcyclopentadienyl)zirconium, tris(diethylamino)(ethylcyclopentadienyl)zirconium, tris(ethylmethylamino)(cyclopentadienyl)zirconium, tris(ethylmethylamino)(methylcyclopentadienyl)zirconium, tris(ethylmethylamino)(ethylcyclopentadienyl)zirconium, tetrakis(dimethylamino)hafnium (TDMAH), tetrakis(diethylamino)hafnium (TDEAH), tetrakis(ethylmethylamino)hafnium (TEMAH), tris(dimethylamino)(cyclopentadienyl)hafnium, tris(dimethylamino)(methylcyclopentadienyl)hafnium, tris(dimethylamino)(ethylcyclopentadienyl)hafnium, tris(diethylamino)(cyclopentadienyl)hafnium, tris(diethylamino)(methylcyclopentadienyl)hafnium, tris(diethylamino)(ethylcyclopentadienyl)hafnium, tris(ethylmethylamino)(cyclopentadienyl)hafnium, tris(ethylmethylamino)(methylcyclopentadienyl)hafnium, tris(ethylmethylamino)(ethylcyclopentadienyl)hafnium, Titanium chloride ($TiCl_4$), tetrakis(dimethylamino)titanium (TDMAT), tetrakis(diethylamino)titanium (TDEAT), tetrakis(ethylmethylamino)titanium (TEMAT), tantalum chloride ($TaCl_5$), tert-butylimino tri(diethylamino)tantalum (TBTDET), tert-butylimino tri(dimethylamino)tantalum (TBTDMT), tert-butylimino tri(ethylmethylamino)tantalum (TBTEMT), ethylimino tri(diethylamino)tantalum (EITDET), ethylimino tri(dimethylamino)tantalum (EITDMT), ethylimino tri(ethylmethylamino)tantalum (EITEMT), tert-amylimino tri(dimethylamino)tantalum (TAIMAT), tert-amylimino tri(diethylamino)tantalum, pentakis(dimethylamino)tantalum, tert-amylimino tri(ethylmethylamino)tantalum, tungsten hexachloride, tungsten pentachloride, bis(tert-butylimino)bis(dimethylamino)tungsten (BTBMW), bis(tert-butylimino)bis(diethylamino)tungsten, bis(tert-butylimino)bis(ethylmethylamino)tungsten, and combinations thereof.

14. The method of claim 11, wherein the nitrogen-source is selected from the group consisting of ammonia, monoalkylhydrazine, dialkylhydrazine, tert-butylamine, methylamine, ethylamine, ethylenediamine, and mixtures thereof.

15. A film formed in accordance with the method of claim 1.

16. A titanium-doped silicon nitride or a titanium-doped silicon carbonitride film formed in accordance with the method of claim 11, wherein the film has one or more of the following characteristics: a density of 2.0 grams per cubic centimeter (g/cc) or greater, hydrogen content less than 20 atomic weight percent %, a refractive index of 1.80 or greater, and combinations thereof.

17. A zirconium-doped silicon nitride or a zirconium-doped silicon carbonitride film formed in accordance with the method of claim 11, wherein the film has one or more of the following characteristics: a density of 2.0 grams per cubic centimeter (g/cc) or greater, hydrogen content less than 20 atomic weight percent %, a refractive index of 1.80 or greater, and combinations thereof.

18. A hafnium-doped silicon nitride or a hafnium-doped silicon carbonitride film formed in accordance with the method of claim 11, wherein the film has one or more of the following characteristics: a density of 2.0 grams per cubic centimeter (g/cc) or greater, hydrogen content less than 20 atomic weight percent %, a refractive index of 1.80 or greater, and combinations thereof.

19. A tantalum-doped silicon nitride or a tantalum- doped silicon carbonitride film formed in accordance with the method of claim 11, wherein the film has one or more of the following characteristics: a density of 2.0 grams per cubic centimeter (g/cc) or greater, hydrogen content less than 20 atomic weight percent %, a refractive index of 1.80 or greater, and combinations thereof.

20. A tungsten-doped silicon nitride or a tungsten- doped silicon carbonitride film formed in accordance with the method of claim 11, wherein the film has one or more of the following characteristics: a density of 2.0 grams per cubic centimeter (g/cc) or greater, hydrogen content less than 20 atomic weight percent %, a refractive index of 1.80 or greater, and combinations thereof.

\* \* \* \* \*